(12) United States Patent
Endoh et al.

(10) Patent No.: US 6,483,402 B2
(45) Date of Patent: Nov. 19, 2002

(54) SURFACE ACOUSTIC WAVE DEVICE

(75) Inventors: Gou Endoh, Suzaka (JP); Osamu Kawachi, Suzaka (JP); Masanori Ueda, Suzaka (JP)

(73) Assignee: Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 09/748,115

(22) Filed: Dec. 27, 2000

(65) Prior Publication Data

US 2001/0022544 A1 Sep. 20, 2001

(30) Foreign Application Priority Data

Mar. 17, 2000 (JP) ........................................ 2000-077007

(51) Int. Cl.[7] ................................................ H03H 9/64
(52) U.S. Cl. ..................... 333/193; 333/195; 310/313 R
(58) Field of Search ................................. 333/193, 194, 333/195, 196; 310/313 R, 313 B

(56) References Cited

U.S. PATENT DOCUMENTS

| | | | | |
|---|---|---|---|---|
| 5,568,002 A | * | 10/1996 | Kawakatsu et al. | 310/313 B |
| 5,585,684 A | * | 12/1996 | Abe | 310/313 A |
| 5,717,367 A | * | 2/1998 | Murai | 333/195 |
| 5,721,519 A | * | 2/1998 | Onishi et al. | 333/193 |
| 5,844,453 A | * | 12/1998 | Matsui et al. | 333/193 |
| 5,896,071 A | * | 4/1999 | Dai et al. | 333/193 |
| 5,963,114 A | * | 10/1999 | Ueda et al. | 333/195 |
| 5,994,980 A | * | 11/1999 | Tada | 333/193 |

* cited by examiner

Primary Examiner—Robert Pascal
Assistant Examiner—Dean Takaoka
(74) Attorney, Agent, or Firm—Arent Fox Kintner Plotkin & Kahn

(57) ABSTRACT

The present invention provides a surface acoustic wave filter having an unbalance-to-balance conversion function and an impedance conversion function. This surface acoustic wave filter includes a piezoelectric substrate, a first surface acoustic wave filter that is made up of input and output interdigital transducers (IDTs), and a second surface acoustic wave filter that is also made up of input and output IDTs. The phase difference between the first surface acoustic wave filter and the second surface acoustic wave filter is approximately 180°. The input IDT of the first surface acoustic wave filter is connected to the input IDT of the second surface acoustic wave filter by a connecting wire, and a terminal extending from this connecting wire serves as an unbalanced terminal. An output terminal extends from the output IDTs of the first surface acoustic wave filter that are not connected to the second surface acoustic wave filter, and another output terminal extends from the output IDTS of the second surface acoustic wave filter that are not connected to the first surface acoustic wave filter. These output terminals constitute a balanced terminal 35.

24 Claims, 31 Drawing Sheets

SURFACE ACOUSTIC WAVE DEVICE

BACKGROUND OF THE INVENTION

1. Field of the Invention

The present invention generally relates to surface acoustic wave filters, and, more particularly, to a surface acoustic wave filter used in a high-frequency circuit of a wireless device such as a portable telephone.

2. Description of the Related Art

In general, surface acoustic wave devices are widely used as filters in high-frequency circuits of wireless communication devices such as portable telephones. FIG. 1 is a block diagram of a high-frequency terminal of a portable telephone that comprises surface acoustic wave devices as a reception filter 4 and a transmission filter 8.

On the reception side, a signal inputted through an antenna 1 is filtered by a branching filter 2 so as to obtain a signal having a certain frequency. The filtered signal is then subjected to amplification in a low noise amplifier 3, and supplied to the reception filter 4 constituted by a surface acoustic wave device. The signal is subjected to passband restriction in the reception filter 4, and then superimposed on a carrier generated by a local oscillator 6 in a mixer IC 5A. The superimposed signal is transmitted to an intermediate frequency unit. On the other hand, a transmission signal from a modulator is superimposed on a carrier generated by the local oscillator 6 in a mixer IC 7. The superimposed signal is then subjected to passband restriction in the transmission filter 8, and then amplified by a power amplifier 9. The amplified signal is then filtered by the branching filter 2, and transmitted through the antenna 1.

In recent years, in such a high-frequency circuit of a wireless communication device, a mixer IC having balanced input and output, or differential input and output has been used. FIG. 2 is a circuit block diagram of the high-frequency unit of a portable telephone having a balanced mixer IC 5B. As shown in FIG. 2, the balanced mixer IC 5B comprises a pair of input terminals 11A and 11B. Using the balanced mixer IC 5B, an adverse influence from noise can be reduced, and the output can be stabilized. Thus, the characteristics of the portable telephone can be improved.

However, the conventional surface acoustic wave filter, which constitutes the reception filter 4, requires a balance-unbalance conversion transformer 10 or an independent conversion circuit that performs balance-unbalance conversion between the reception filter 4 and the balanced mixer IC 5B, because the input and output terminals of the reception filter 4 are unbalanced.

Furthermore, the surface acoustic wave filter, which constitutes the reception filter 4, has a normal impedance of 50Ω, while the balanced mixer IC 5B, which comprises the balanced input terminals 11A and 11B, has a higher impedance of 100 to 200Ω. Therefore, an impedance conversion circuit is also required to connect the reception filter 4 and the balanced mixer IC 5B.

For the above reasons, with the balanced mixer IC 5B, the characteristics of the portable telephone can be improved, but the number of components is increased. As a result, the demands for smaller, lighter, and less expensive portable telephones cannot be satisfied.

SUMMARY OF THE INVENTION

A general object of the present invention is to provide surface acoustic wave devices in which the above disadvantages are eliminated.

A more specific object of the present invention is to provide a surface acoustic wave device that has an unbalance-balance conversion function and an impedance conversion function.

The above objects of the present invention are achieved by a surface acoustic wave device that includes:
  a piezoelectric substrate;
  a first surface acoustic wave filter that is formed on the piezoelectric substrate, and has at least one input interdigital transducer and at least one output interdigital transducer arranged alternately on a surface acoustic wave path on the piezoelectric substrate; and
  a second surface acoustic wave filter that is formed on the piezoelectric substrate, and has at least one input interdigital transducer and at least one output interdigital transducer arranged alternately on the surface acoustic wave path on the piezoelectric substrate, the phase difference between the first surface acoustic wave filter and the second surface acoustic wave filter being approximately 180°.

In this surface acoustic wave device, the input interdigital transducers of the first surface acoustic wave filter and the second surface acoustic wave filter are electrically connected, or the output interdigital transducers of the first surface acoustic wave filter and the second surface acoustic wave filter are electrically connected. A terminal extending from the connecting point between the first and second surface acoustic wave filters serves as an unbalanced terminal. Among the interdigital transducers disposed to the first and second surface acoustic wave filters, those unconnected between the first and second surface acoustic wave filters have terminals extending therefrom, and the terminals serve as a balanced terminal.

According to the present invention described above, the surface acoustic wave device has the unbalanced terminal on the input side and the balanced terminal as the output side. With such a structure, a circuit or component that performs balance-unbalance conversion is no longer required. Accordingly, the number of components, the size, the weight, and the cost of an electronic apparatus (such as a portable telephone having a balanced mixer IC) can be reduced.

The above objects of the present invention are also achieved by a surface acoustic wave device that includes:
  a piezoelectric substrate; and
  five interdigital transducers that are disposed on a surface acoustic wave path on the piezoelectric substrate.

Among the five interdigital transducers, the first, third, and fifth interdigital transducers counted from one end of the device are input interdigital transducers and electrically connected at electrodes on one side, and a terminal extending from the connecting point between the first, third, and fifth interdigital transducers serves as an unbalanced terminal. On the other hand, the second and fourth interdigital transducers counted from the one end of the device serve as output interdigital transducers and are electrically connected at electrodes on the other side. The phase difference between the electrodes on the one side and the electrodes on the other side of the second and fourth output interdigital transducers is 180°. A first terminal extends from the connecting point between the electrically connected electrodes on the one side of the second and fourth interdigital transducers, while a second terminal extends from the connecting point between the electrically connected electrodes on the other side of the second and fourth interdigital transducers. The first terminal and second terminal constitute a balanced terminal.

The surface acoustic wave device of the present invention has an unbalanced terminal on the input side and a balanced terminal on the output side. Accordingly, a circuit or component that performs balance-unbalance conversion is no longer required. Thus, the number of components, the size, the weight, and the cost of an electronic apparatus (such as a portable telephone comprising a balanced mixer IC) having the surface acoustic wave device mounted thereon can be effectively reduced.

Furthermore, with the surface acoustic wave device including the five interdigital transducers (5-IDT filter), a stable characteristics can be obtained in a wider passband.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 3:
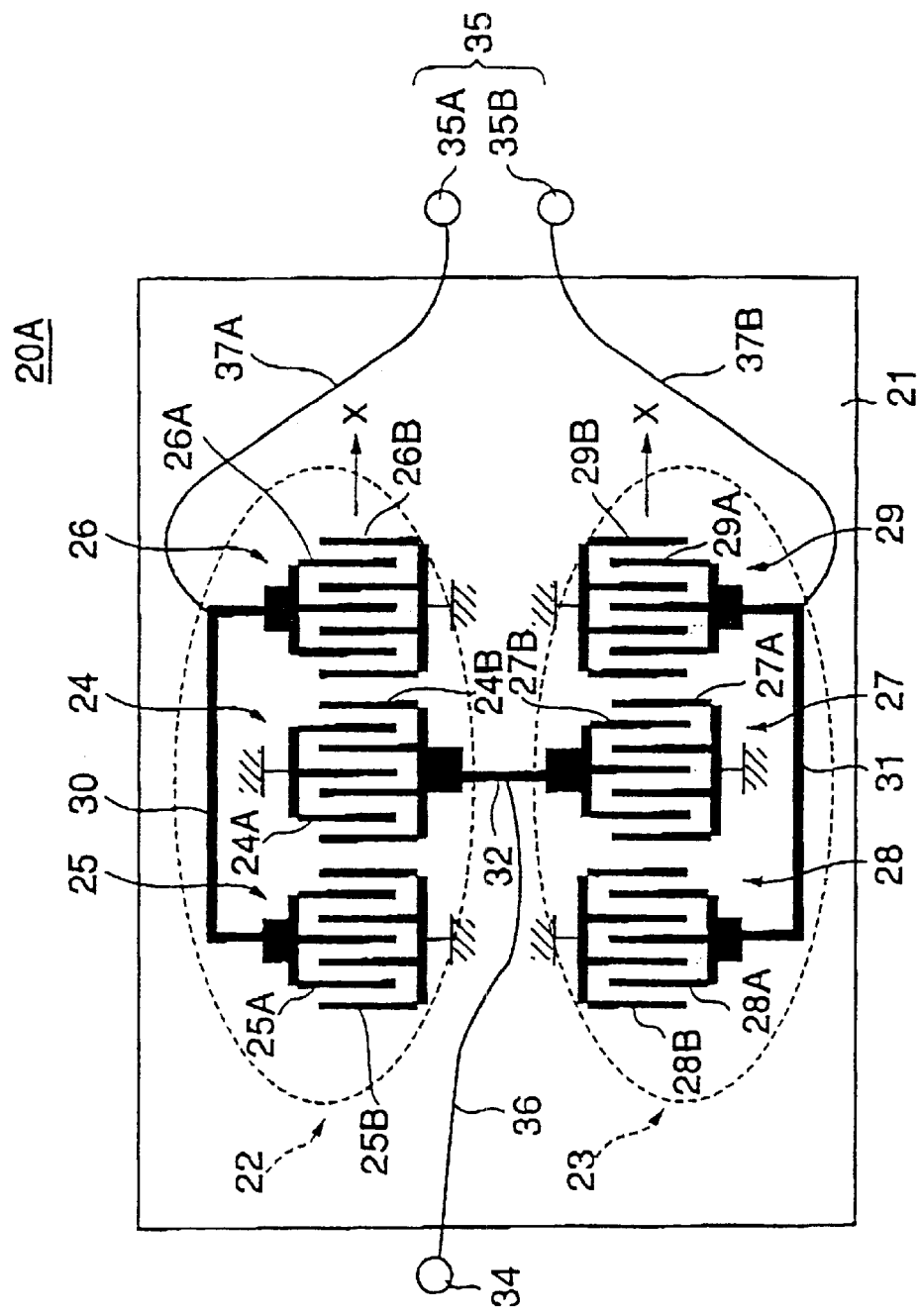
FIG. 3 shows a surface acoustic wave device of a first embodiment of the present invention.

FIG. 3 shows a surface acoustic wave device 20A of a first embodiment of the present invention. This surface acoustic wave device 20A comprises a piezoelectric substrate 21, a first surface acoustic wave filter 22, and a second surface acoustic wave filter 23.

The piezoelectric substrate 21 is a rotated-Y single crystal plate of $LiTaO_3$ having a cut angle between 40° Y and 44° Y. The piezoelectric substrate 21 can prevent the occurrence of a spurious peak, and contributes to realizing a high-quality surface acoustic wave device without causing attenuation of a surface acoustic wave in the GHz band. With a rotated-Y single crystal plate of $LiNbO_3$ having a cut angle between 66° Y to 74° Y, the same effects can be achieved.

The first surface acoustic wave filter 22 comprises an input interdigital transducer 24 (Hereinafter, "interdigital transducer" will be referred to as "IDT".), and two output IDTs 25 and 26 that sandwich the input IDT 24. The IDTs 24 to 26 are aligned in the propagation direction of the surface acoustic wave (i.e., the direction pointed to by the arrow X in FIG. 3).

The IDTs 24 to 26 are formed by first electrodes 24A to 26A and second electrodes 24B to 26B, respectively. Each of the electrodes 24A to 26A and 24B to 26B has a comb-like shape. The first electrode 24A of the input IDT 24 is connected to the ground, while the second electrode 24B of the input IDT 24 is connected to the second surface acoustic wave filter 23. The first electrode 25A of the output IDT 25 is connected to the first electrode 26A of the output IDT 26 by a connecting wire 30. Further, the respective second electrodes 25B and 26B of the output IDTs 25 and 26 are connected to the ground.

Meanwhile, the second surface acoustic wave filter 23 substantially has the same structure as the first surface acoustic wave filter 22, comprising an input IDT 27 and two output IDTs 28 and 29 that sandwich the input IDT 27. The IDTs 27 to 29 are aligned in the propagation direction of the surface acoustic wave (i.e., the direction pointed to by the arrow X in FIG. 3).

The IDTs 27 to 29 are constituted by first electrodes 27A to 29A and second electrodes 27B to 29B each having a comb-like shape. The first electrode 27A of the input IDT 27 is connected to the ground. The second electrode 27B of the input IDT 27 is connected to the second electrode 24B of the input IDT 24 of the first surface acoustic wave filter 22 by a connecting wire 32. The first electrode 28A of the output IDT 28 is connected to the first electrode 29A of the output IDT 29 by a connecting wire 31. The respective second electrodes 28B and 29B of the output IDTs 28 and 29 are connected to the ground.

As described above, the first surface acoustic wave filter 22 and the second surface acoustic wave filter 23 substantially have the same structure. However, the direction of the first and second electrodes 24A and 24B of the input IDT 24 is opposite to the direction of the first and second electrodes 27A and 27B of the input IDT 27. Accordingly, the phase difference between the first surface acoustic wave filter and the second surface acoustic wave filter is approximately 180°.

In the above structure, an unbalanced input terminal 34 is disposed to the connecting wire 32 that electrically connects the input IDTs 24 and 27 of the surface acoustic wave filters 22 and 23. More specifically, one end of an input wire 36 is connected to the connecting wire 32 that connects the input IDTs 24 and 27, and the other end of the input wire 36 is connected to the unbalanced input terminal 34.

Meanwhile, the first electrodes 25A and 26A of the output IDTs 25 and 26 that are unconnected to the second surface acoustic wave filter 23 are connected by the connecting wire 30. One end of an output wire 37A is connected to the connecting wire 30, and the other end of the output wire 37A serves as an output terminal 35A.

The first electrodes 28A and 29A of the output IDTs 28 and 29, which are unconnected to the first surface acoustic wave filter 22, are connected by the connecting wire 31. One end of an output wire 37B is connected to the connecting wire 31, and the other end of the output wire 37B serves as an output terminal 35B.

In the surface acoustic wave device 20A of this embodiment, the output phase difference between the first surface acoustic wave filter 22 and the second surface acoustic wave filter 23 is approximately 180°, as described above. Accordingly, the output terminal 35A extending from the first electrodes 25A and 26A of the first surface acoustic wave filter 22, and the output terminal 35B extending from the first electrodes 28A and 29A of the second surface acoustic wave filter 23 constitute a balanced terminal (Hereinafter, the output terminals 35A and 35B will be referred to as "balanced terminals", and the pair of the balanced terminals 35A and 35B will be referred to as "balanced terminal".).

Figure 1:
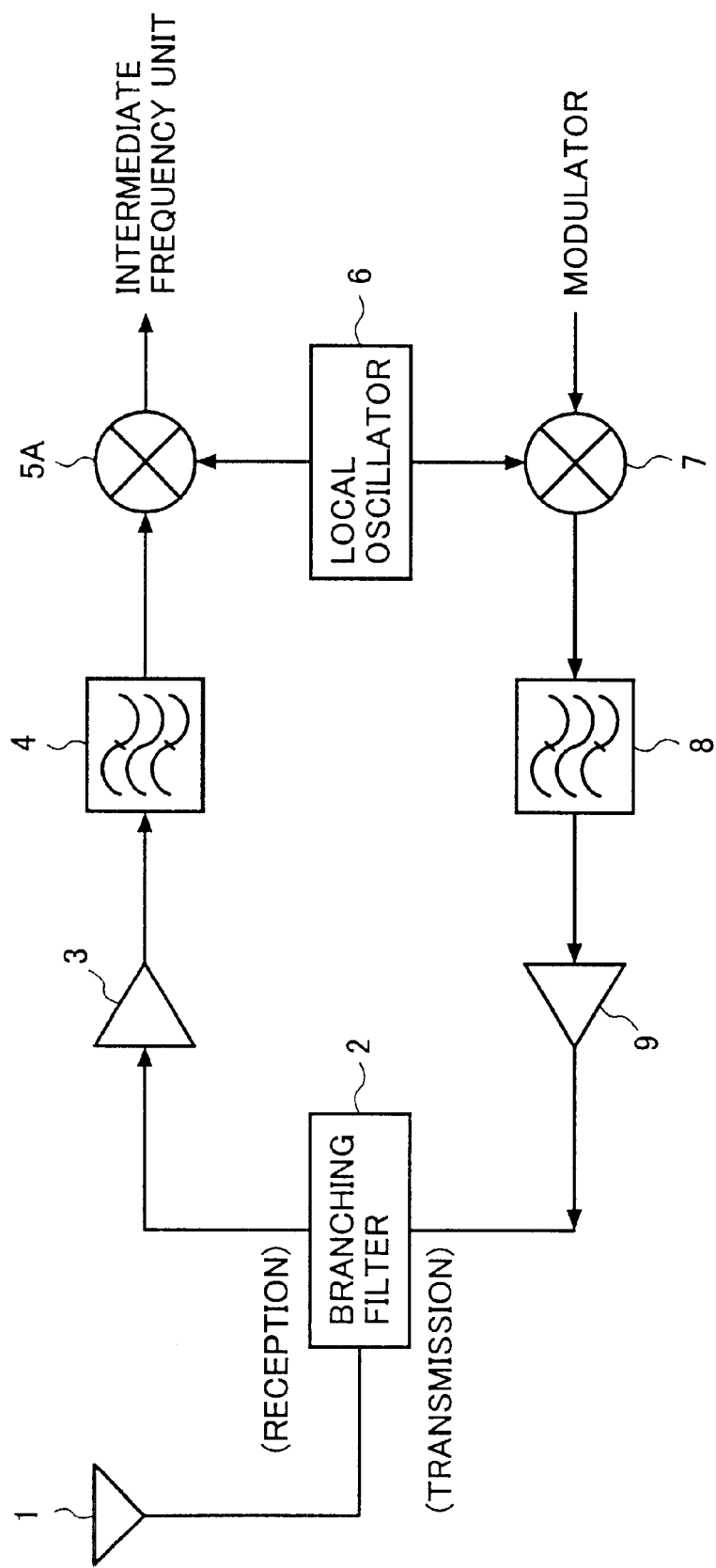
FIG. 1 is a block diagram of a portable terminal device that includes an example of conventional surface acoustic wave devices.
Figure 2:
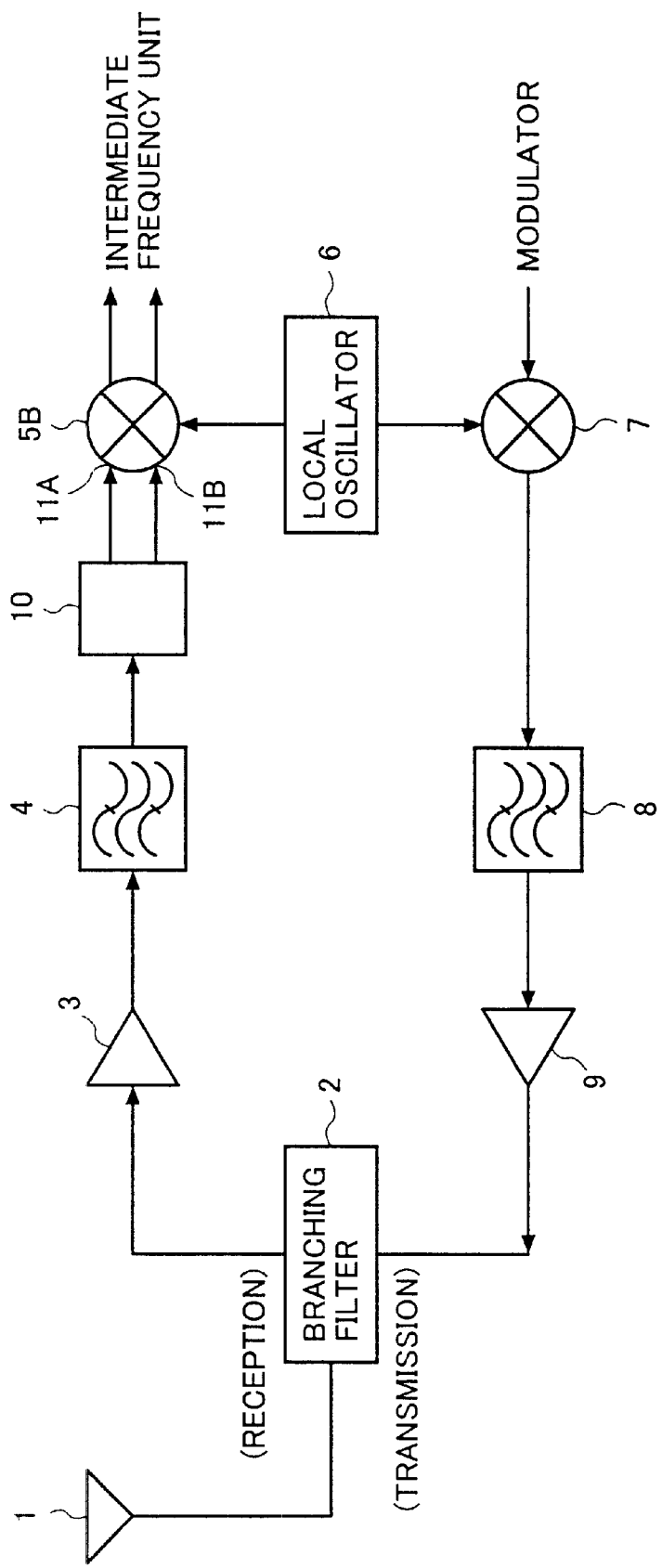
FIG. 2 is a block diagram of a portable terminal device that includes another example of conventional surface acoustic wave devices.

As described above, the surface acoustic wave device 20A of this embodiment has the unbalanced input terminal 34 on the input side, and has the balanced terminals 35A and 35B (differential terminals) on the output side. When the surface acoustic wave device 20A of the present invention is employed in a portable telephone having a balanced mixer IC, for instance, a circuit or component conventionally required for performing unbalance-to-balance conversion (see FIG. 2) is no longer required. Thus, the surface acoustic wave device 20A can reduce the number of components, the size, the weight, and the cost of such a portable telephone.

Figure 4:
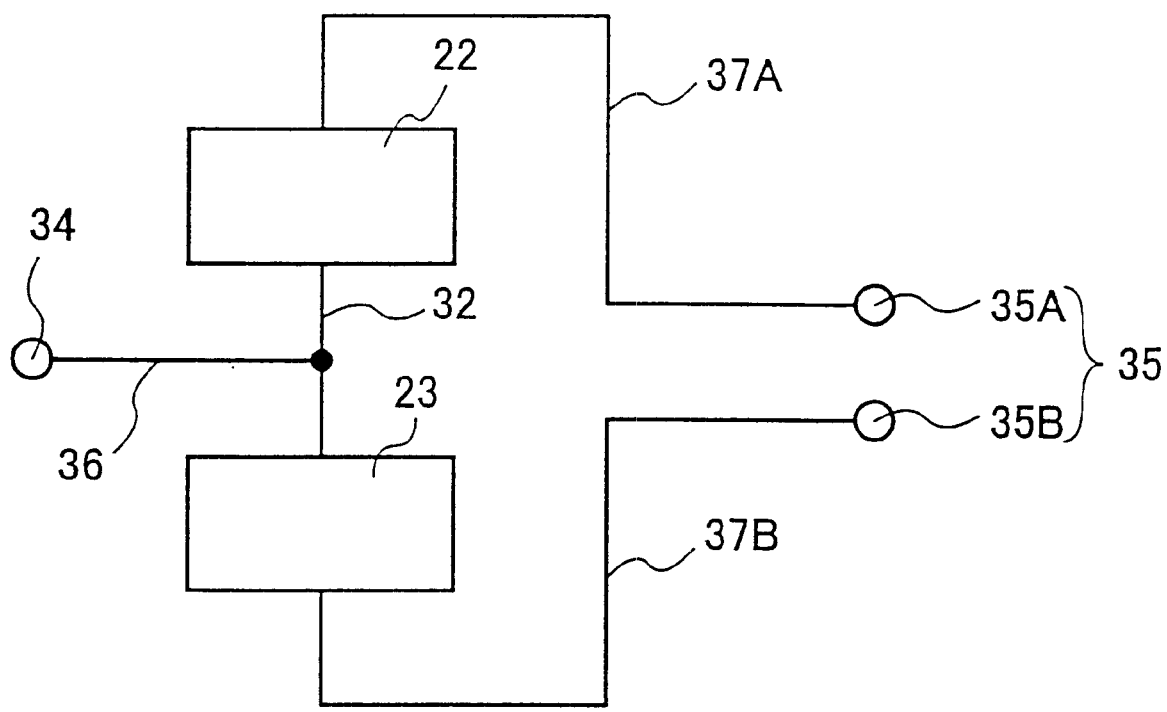
FIG. 4 is a circuit diagram of a surface acoustic wave device of the first embodiment of the present invention.

Referring now to FIG. 4 as well as FIG. 3, the operational and electric characteristics of the surface acoustic wave device 20A will be described. FIG. 4 is a circuit diagram of the surface acoustic wave device 20A.

In the surface acoustic wave device 20A, having the above structure, a high-frequency signal inputted from the unbalanced input terminal 34 is divided in half and distributed to the first and second surface acoustic wave filters 22 and 23. The signal inputted into the first surface acoustic wave filter 22 is converted into a surface acoustic wave by the input IDT 24, and then propagated in the direction perpendicular to the comb teeth (i.e., the direction indicated by the arrow X in FIG. 3) on the piezoelectric substrate 21. The surface acoustic wave received by the output IDTs 25 and 26 is then converted into an electric signal, and outputted to the balanced output terminal 35A.

Likewise, the signal inputted into the second surface acoustic wave filter 23 is converted into a surface acoustic wave by the input IDT 27, and propagated in the direction perpendicular to the comb teeth (i.e., the direction indicated by the arrow X in FIG. 3) on the piezoelectric substrate 21. The surface acoustic wave received by the output IDTs 28 and 29 is then converted into an electric signal, and outputted to the balanced output terminal 35B.

The directions of the output IDTs 25, 26, 28, and 29 are the same. However, the directions of the input IDTs 24 and 27 are opposite to each other. As a result, the phase difference between the two output electric signals is approximately 180°, and the two balanced output terminals 35A and 35B constitute the balanced terminal 35.

In the structure of this embodiment, the unbalanced input terminal 34 is electrically connected in parallel to the first and second surface acoustic wave filters 22 and 23, as shown in FIG. 4. If the input impedance of the first surface acoustic filter 22 is equal to the input impedance of the second surface acoustic filter 23 (with each input impedance being R1), the impedance ($R_{IN}$) of the unbalanced input terminal 34 is approximately one half of the impedance of each of the surface acoustic wave filters 22 and 23 ($R_{IN} \approx R1/2$).

Meanwhile, the balanced terminals 35A and 35B appear to be connected in series. Accordingly, if the output impedance of the first surface acoustic wave filter 22 is equal to the output impedance of the second surface acoustic wave filter 23 (each output impedance being R2), the impedance ($R_{OUT}$) of the balanced terminals 35A and 35B is approximately twice as high as the output impedance of each of the first and second surface acoustic wave filters 22 and 23 ($R_{OUT} \approx 2 \times R2$).

If the input impedance and output impedance of each of the first and second surface acoustic wave filters 22 and 23 are equal (i.e., R1=R2), the impedance ($R_{OUT}$) of the balanced terminals 35A and 35B is four times as high as the impedance of the unbalanced input terminal 34 ($R_{OUT} \approx 4 \times R_{IN}$). In this manner, impedance conversion is carried out in the surface acoustic wave device 20A. This impedance conversion can be arbitrarily carried out by arbitrarily setting the input and output impedance of each of the surface acoustic wave filters 22 and 23, and/or arbitrarily changing the connection among the IDTs 24 to 29.

Accordingly, even if the input impedance of the surface acoustic wave device 20A is not equal to the impedance of an electronic part connected to the surface acoustic wave device 20A (such as the balanced mixer IC 5A shown in FIG. 2), a circuit or component that carries out impedance conversion is no longer required, thereby reducing the number of components, the size, the weight, and the cost of the electronic device provided with the surface acoustic wave device 20A.

Figure 5:
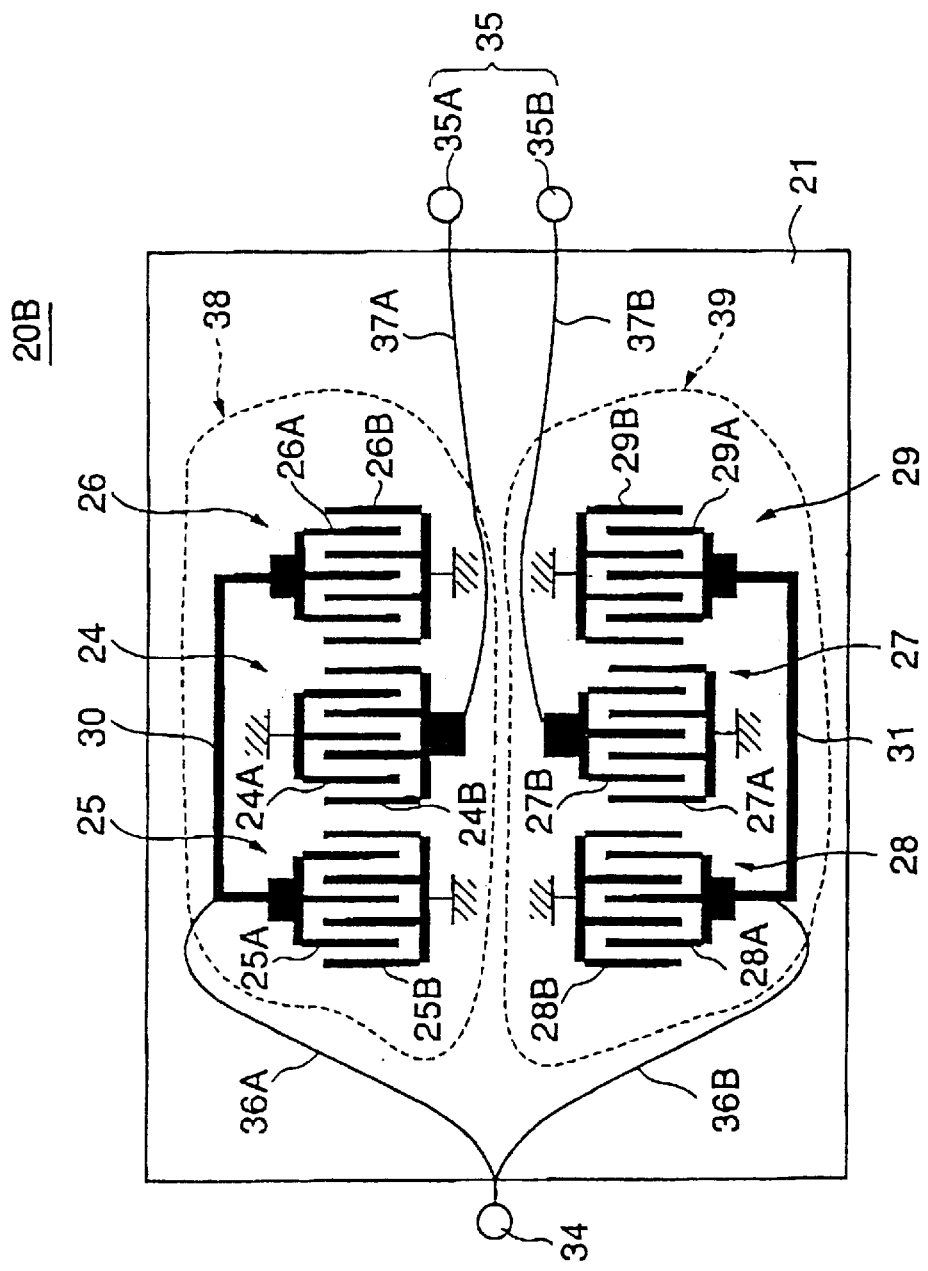
FIG. 5 shows a surface acoustic wave device of a second embodiment of the present invention.

FIG. 5 shows a surface acoustic wave device 20B of a second embodiment of the present invention. In FIG. 5 and the following drawings, the same components as in FIG. 3 are denoted by the same reference numerals, and explanations for those components are omitted.

The surface acoustic wave filters 22 and 23 that constitute the surface acoustic wave device 20A shown in FIG. 3 have the IDTs 24 and 27 as the input IDTs, and the IDTs 25, 26, 28, and 29 as the output IDTs. The surface acoustic wave filters 22 and 23 are so-called 1-input and 2-output type surface acoustic wave filters. On the other hand, the surface acoustic wave device 20B of this embodiment includes first and second surface acoustic wave filters 38 and 39, each of which has two inputs and one output.

In the surface acoustic wave device 20B of this embodiment, the first electrodes 25A and 26A of the input IDTs 25 and 26 of the first surface acoustic wave filter 38 are connected to each other by the connecting wire 30, which is connected to the unbalanced input terminal 34 by the input wire 36A. Likewise, the first electrodes 28A and 29A of the input IDTs 28 and 29 of the second surface acoustic wave filter 39 are connected to each other by the connecting wire 31, which is connected to the unbalanced input terminal 34 by an input wire 36B. The second electrodes 25B, 26B, 28B, and 29B of the input IDTs 25, 26, 28, and 29 are connected to the ground.

Meanwhile, the output IDT 24 of the first surface acoustic wave filter 38 and the output IDT 27 of the second surface acoustic wave filter 29 are designed so that the output phase difference between them is 180°. The second electrode 24B of the output IDT 24 of the first surface acoustic wave filter 38 is connected to the balanced output terminal 35A by the output wire 37A, and the second electrode 27B of the output IDT 27 of the second surface acoustic wave filter 39 is connected to the balanced output terminal 35B by the output wire 37B. In this manner, the balanced output terminals 35A and 35B constitute a balanced terminal 35. The first electrodes 24A and 27A of the output IDTs 24 and 27 are connected to the ground.

As described above, in the surface acoustic wave device 20B including the 2-input and 1-output surface acoustic wave filters 38 and 39, the unbalanced input terminal 34 serves as an input, and the balanced terminals 35A and 35B (differential terminals) serves as an output, as in the surface acoustic wave device 20A of the first embodiment. Accordingly, when an electronic part (such as the balanced mixer IC 5B shown in FIG. 2) is connected to the surface acoustic wave device 20B, a circuit or component that carries out unbalance-to-balance conversion is no longer required, thereby reducing the number of components, the size, the weight, and the cost of an electronic device (a portable telephone, for instance).

Furthermore, even if the input impedance of the surface acoustic wave device 20B is not equal to the impedance of the electronic part (such as the balanced mixer IC 5A shown in FIG. 2) connected to the surface acoustic wave device 20B, a circuit or component that carries out impedance conversion is no longer required. Thus, the electronic device provided with the surface acoustic wave device 20B includes fewer components, and is smaller, lighter, and less costly.

Figure 6:
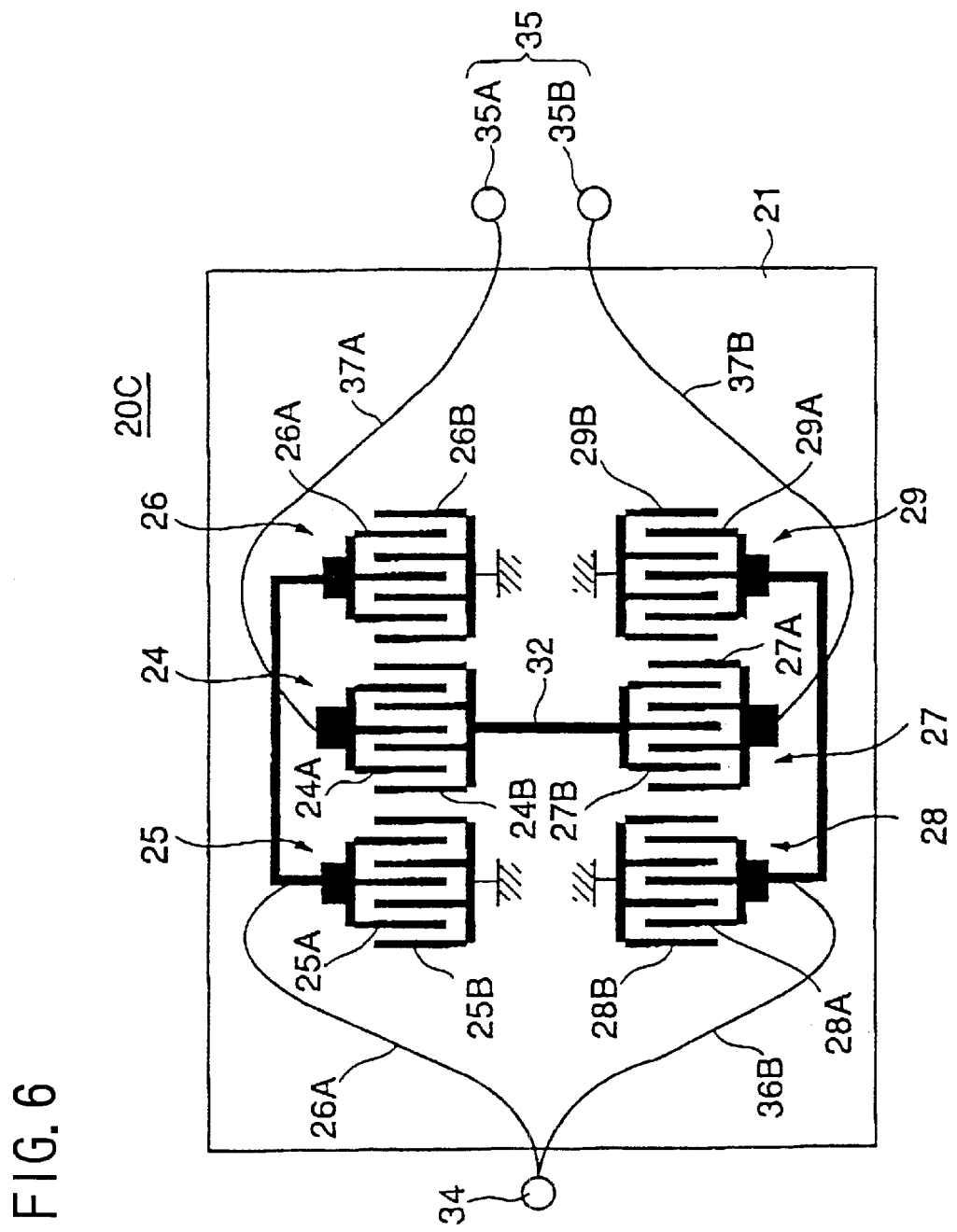
FIG. 6 shows a surface acoustic wave device of a third embodiment of the present invention.

Referring now to FIG. 6, a surface acoustic wave device 20C of a third embodiment of the present invention will be described. This surface acoustic wave device 20C has substantially the same structure as the surface acoustic wave device 20B of the second embodiment shown in FIG. 5, except that the first electrode 24A of the output IDT 24 is connected to the balanced output terminal 35A by the output wire 37A, and that the first electrode 27A of the output IDT 27 is connected to the balanced output terminal 35B by the output wire 37B. C In the surface acoustic wave device 20 of this embodiment, none of the electrodes 24A, 24B, 27A, and 27B of the output IDTs 24 and 27 is grounded. Accordingly, even if a voltage variation is caused in the electrodes 25B, 26B, 28B, and 29B connected to ground wires (not shown) due to an external disturbance, the output IDTs 24 and 27 have no adverse influence from the variation, and generate steady outputs.

Figure 7:
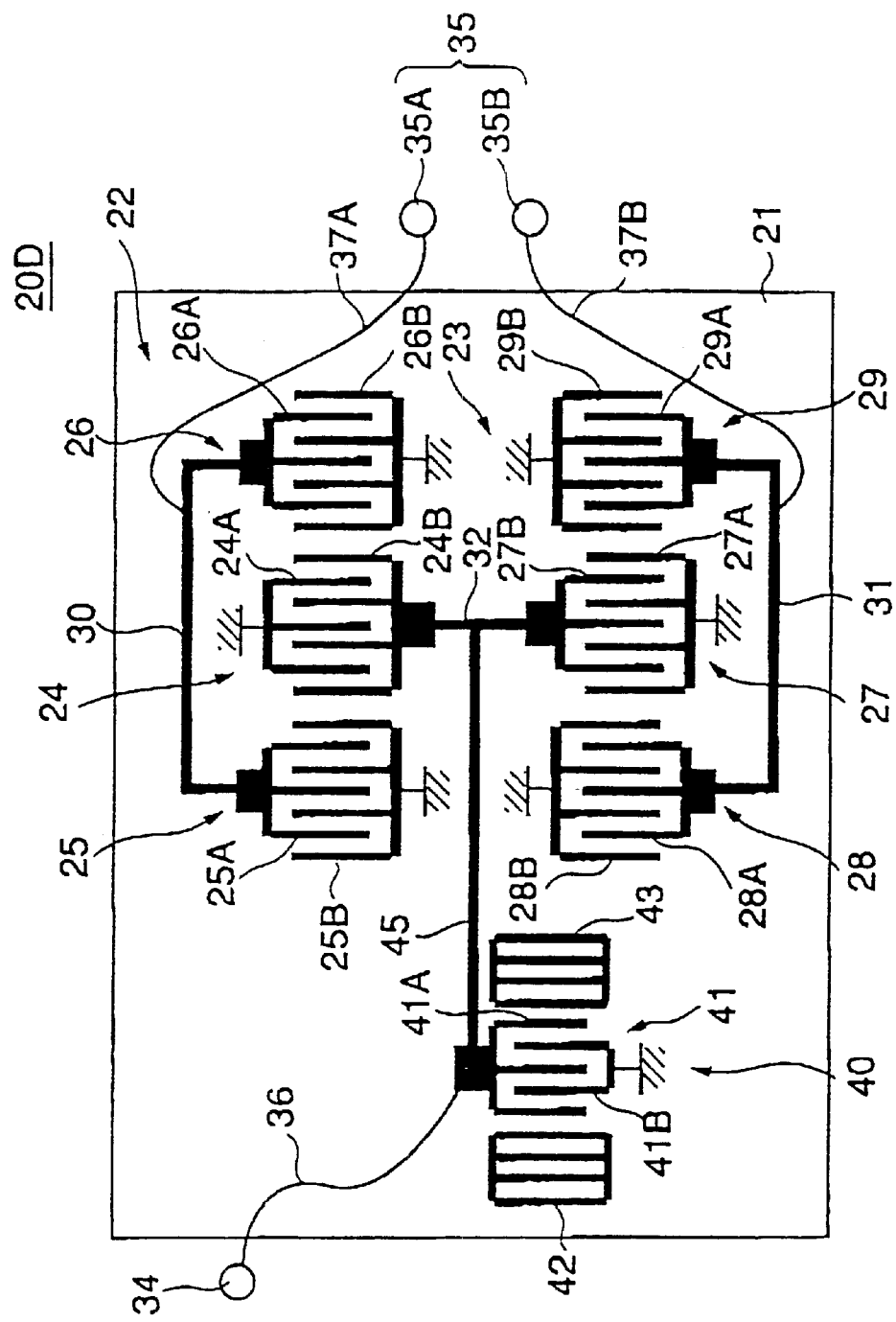
FIG. 7 shows a surface acoustic wave device of a fourth embodiment of the present invention.

FIG. 7 shows a surface acoustic wave device 20D of a fourth embodiment of the present invention. This surface acoustic wave device 20D has a structure similar to the surface acoustic wave device 20A of the first embodiment shown in FIG. 3, except that a surface acoustic wave parallel resonator 40 is disposed on the unbalanced input terminal side.

This surface acoustic wave parallel resonator 40 comprises an IDT 41 and a pair of reflectors 42 and 43 that sandwich the IDT 41. The IDT 41 is made up of a first electrode 41A and a second electrode 41B both having a comb-like shape. The first electrode 41A is connected to the second electrodes 24B and 27B of the input IDTs 24 and 27 by a connecting wire 45 formed as a pattern on the piezoelectric substrate 21. The first electrode 41A is also connected to the unbalanced input terminal 34 by the input wire 36. The second electrode 41B of the IDT 41 is grounded.

Figure 8:
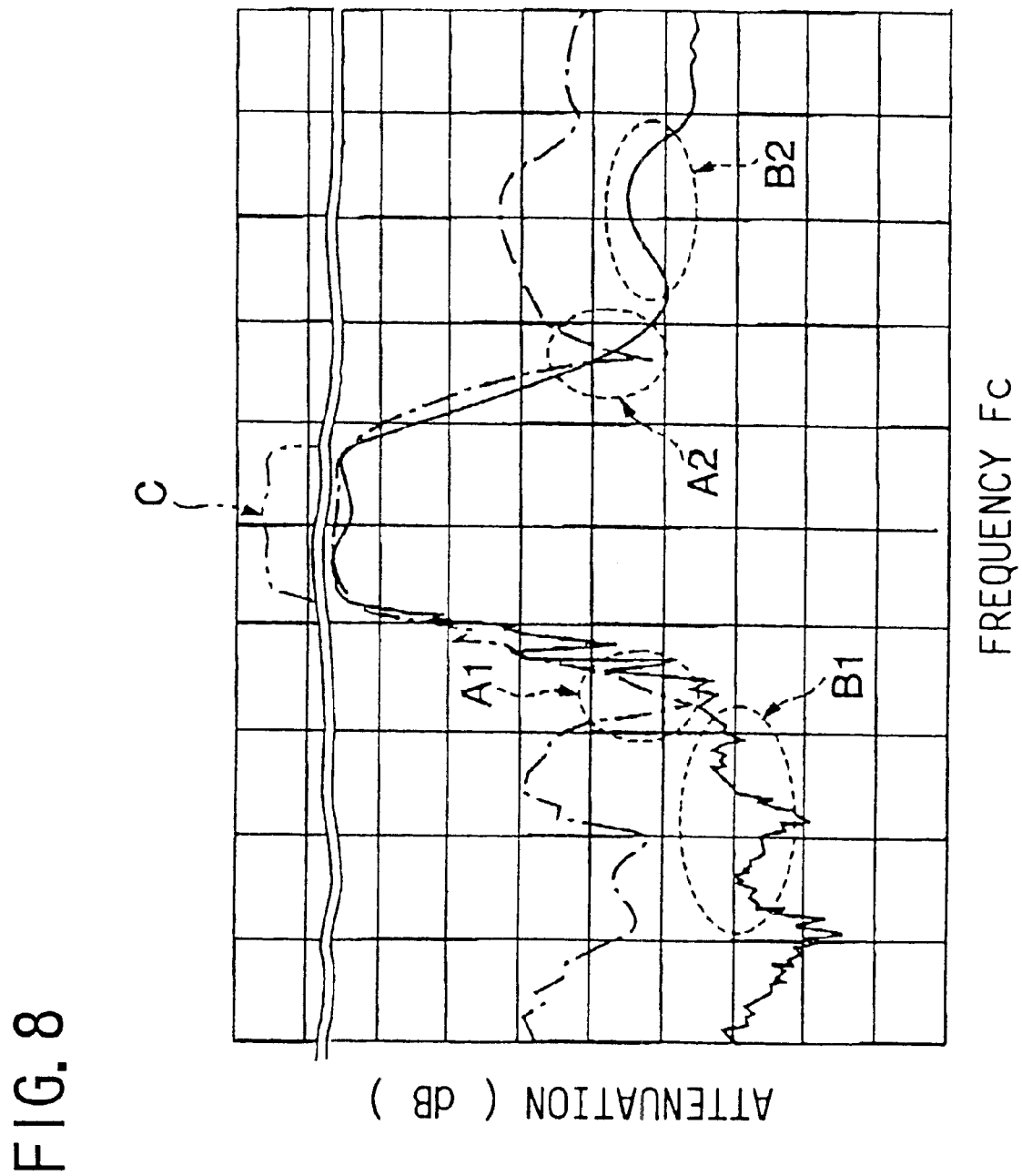
FIG. 8 illustrates the characteristics of the surface acoustic wave of the fourth embodiment.

With the surface acoustic wave parallel resonator 40 having the above structure, the attenuation can suddenly drop in the passband of the surface acoustic wave device 20D, particularly, in the vicinity of the passband on the low-frequency side. FIG. 8 shows the passband characteristics of the surface acoustic wave devices of the present invention. As indicated by the arrow A1, with the surface acoustic wave parallel resonator 40, the attenuation suddenly drops on the low-frequency side.

Accordingly, with the surface acoustic wave device 20D of this embodiment, balanced connection and impedance conversion can be realized. Furthermore, the passband characteristics on the low-frequency side can be improved.

Figure 9:
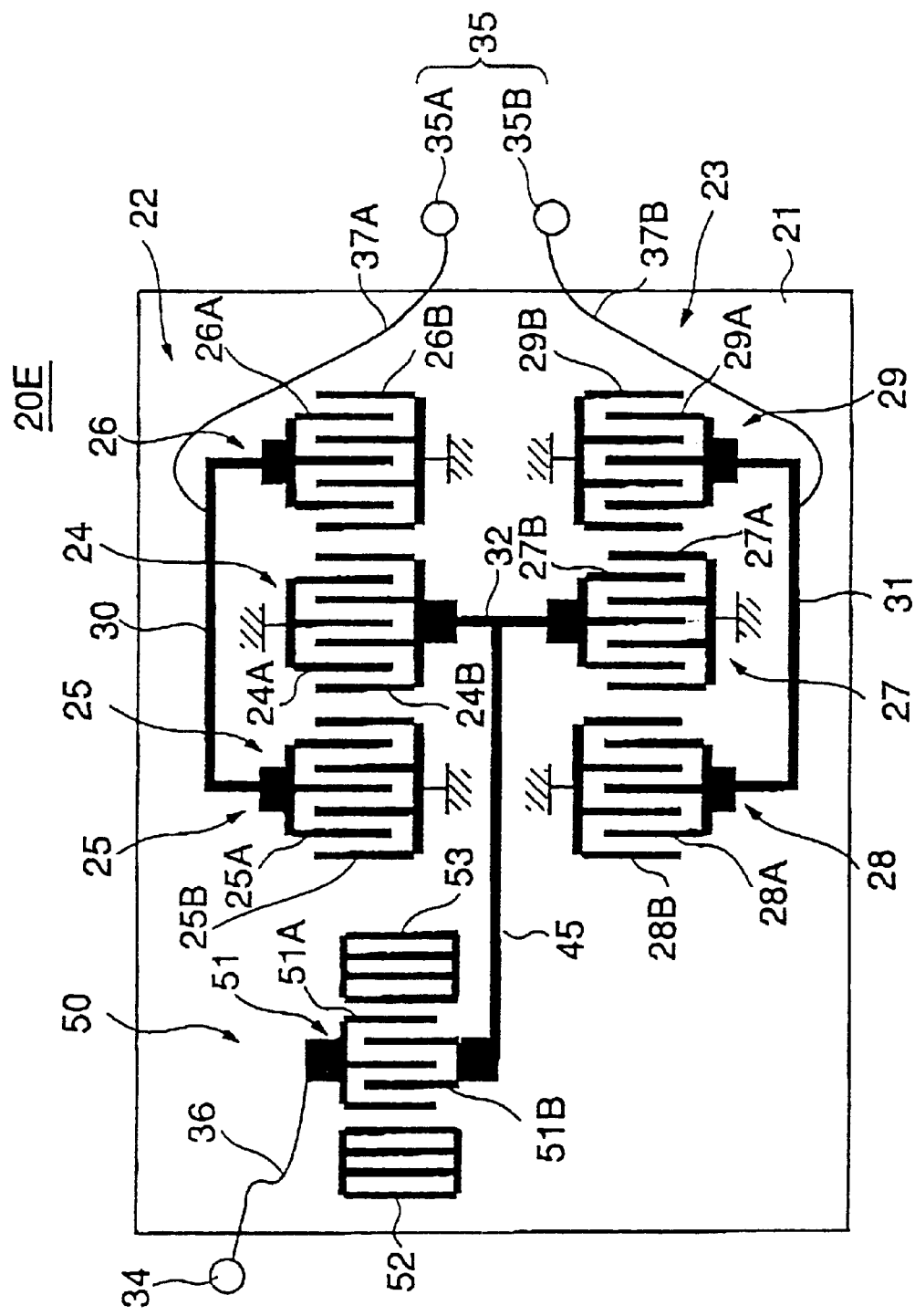
FIG. 9 shows a surface acoustic wave device of a fifth embodiment of the present invention.

FIG. 9 shows a surface acoustic wave device 20E of a fifth embodiment of the present invention. This surface acoustic wave device 20E has a structure similar to the surface acoustic wave device 20A of the first embodiment shown in FIG. 3, except that the surface acoustic wave device 20E of this embodiment has a surface acoustic wave series resonator 50 on the unbalanced terminal side.

This surface acoustic wave series resonator 50 comprises an IDT 51 and a pair of reflectors 52 and 53 that sandwich the IDT 51. The IDT 51 is made up of a first electrode 51A and a second electrode 51B both having a comb-like shape. The second electrode 51B is connected to the second electrodes 24B and 27B of the input IDTs 24 and 27 by the connecting wire 45 formed as a pattern on the piezoelectric substrate 21. The first electrode 51A of the IDT 51 is connected to the unbalanced input terminal 34 by the input wire 36.

In the surface acoustic wave series resonator 50, the attenuation can suddenly drop in the passband of the surface acoustic wave device 20E, particularly, in the vicinity of the passband on the high-frequency side, as indicated by the arrow A2 in FIG. 8. Accordingly, with the surface acoustic wave device 20E of this embodiment, balanced connection and impedance conversion can be realized. Furthermore, the passband characteristics on the high-frequency side can be improved.

Figure 10:
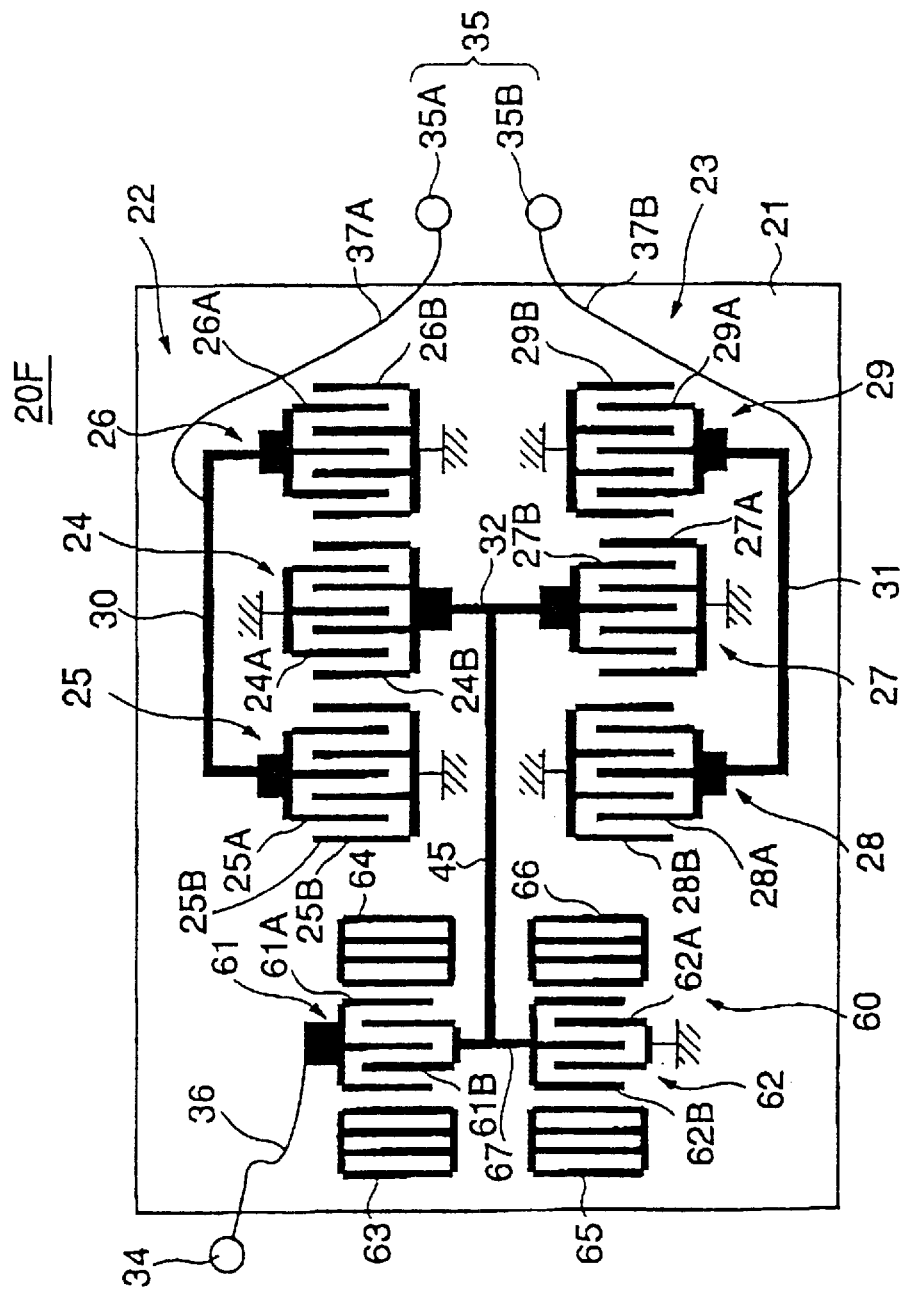
FIG. 10 shows a surface acoustic wave device of a sixth embodiment of the present invention.

FIG. 10 shows a surface acoustic wave device 20F of a sixth embodiment of the present invention. This surface acoustic wave device 20F has a structure that is similar to the surface acoustic wave device 20A of the first embodiment, except that a ladder-type filter 60 is disposed on the unbalanced input terminal side.

This ladder-type filter 60 comprises first and second IDTs 61 and 62, and four reflectors 63 to 66. The first IDT 61 is interposed between the pair of reflectors 63 and 64, and the second IDT 62 is interposed between the pair of reflectors 65 and 66. The first IDT 61 is made up of a first electrode 61A and a second electrode 61B, and the second IDT 62 is made up of a first electrode 62A and a second electrode 62B. Each of the electrodes 61A, 61B, 62A, and 62B has a comb-like shape.

The second electrode 61B of the first IDT 61 is connected to the second electrode 62B of the second IDT 62 by a connecting wire 67. This connecting wire 67 is connected to the second electrodes 24B and 27B of the input IDTs 24 and 27 by the connecting wire 32 and the connecting wire 45 formed as a pattern on the piezoelectric substrate 21. The first electrode 62A of the second IDT 62 is grounded, and the first electrode 61A of the first IDT 61 is connected to the unbalanced input terminal 34.

With the ladder-type filter 60 having the above structure, the attenuation can suddenly drop in the passband of the surface acoustic wave device 20F, particularly, in the vicinity of the passband on both the high- and low-frequency sides, as indicated by the arrows A1 and A2 in FIG. 8. Accordingly, with the surface acoustic wave device 20F of this embodiment, balanced connection and impedance conversion can be carried out. Furthermore, the passband characteristics on both the high- and low-frequency sides can be improved.

Figure 11:
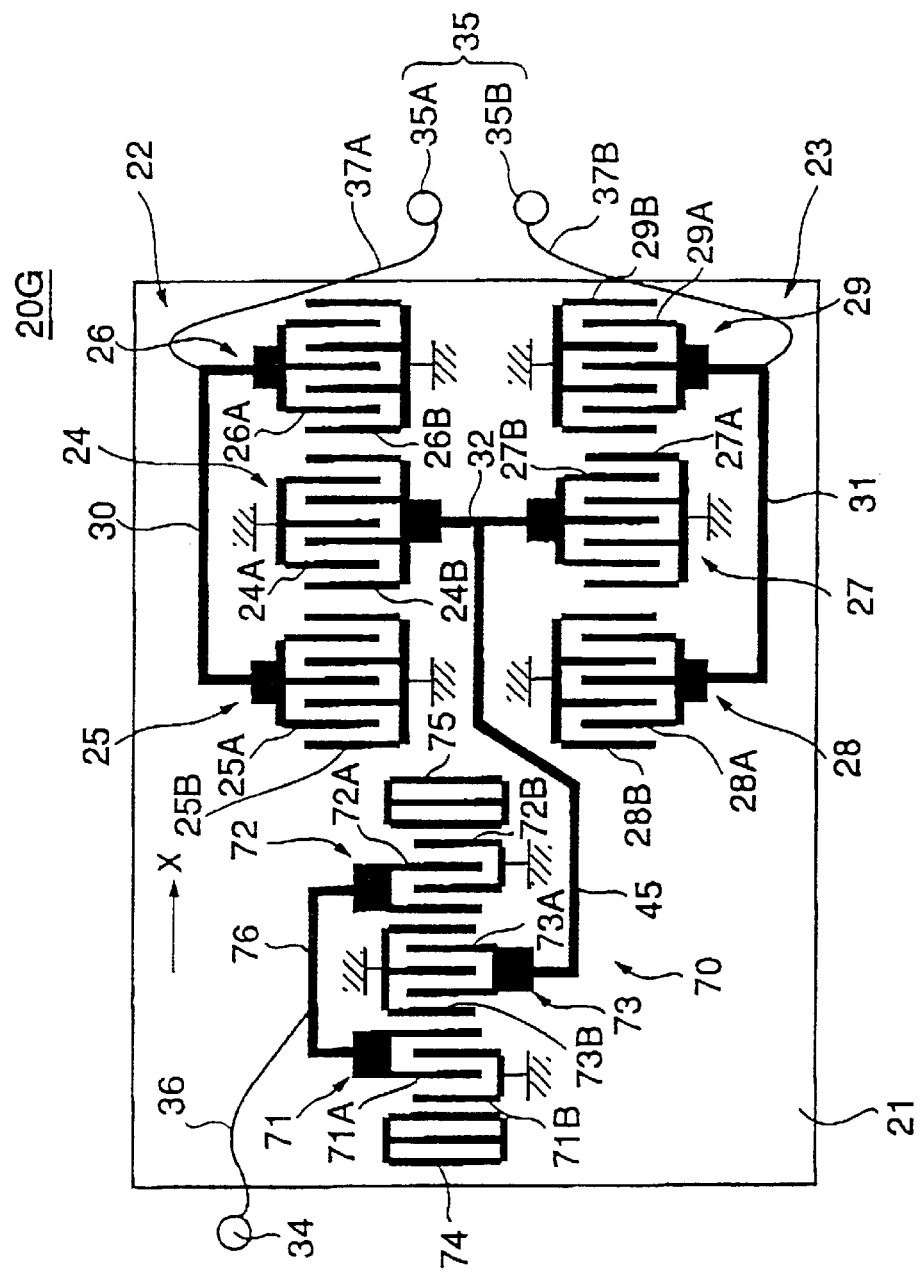
FIG. 11 shows a surface acoustic wave device of a seventh embodiment of the present invention.

FIG. 11 shows a surface acoustic wave device 20G of a seventh embodiment of the present invention. This surface acoustic wave device 20G has a structure that is similar to the surface acoustic wave device 20A of the first embodiment shown in FIG. 3, except that a double-mode filter 70 is disposed on the unbalanced input terminal side.

This double-mode filter 70 comprises two reflectors 74 and 75, and three IDTs 71 to 73 interposed between the reflectors 74 and 75. The reflectors 74 and 75, and the IDTs 71 to 73 are aligned in the propagation direction of surface acoustic waves (i.e., in the direction indicated by the arrow X in FIG. 11).

The three IDTs 71 to 73 are made up of first electrodes 71A to 73A and second electrodes 71B to 73B respectively. Each of the electrodes has a comb-like shape. The first electrode 73A of the output IDT 73 is connected to the second electrodes 24B and 27B of the input IDTs 24 and 27 by the connecting wire 32 and the connecting wire 45 formed as a pattern on the piezoelectric substrate 21. The second electrode 73B of the output IDT 73 is grounded.

The first electrodes 71A and 72A of the input IDTs 71 and 72, which sandwich the output IDT 73, are connected to each other by a connecting wire 76. The second electrodes 71B and 72B of the input IDTs 71 and 72 are grounded. The connecting wire 76 that connects the first electrodes 71A and 72A is connected to the unbalanced input terminal 34 by the connecting wire 36.

With the double-mode filter 70, the attenuation outside the passband can be large, as indicated by the arrows B1 and B2 in FIG. 8. Accordingly, with the surface acoustic wave device 20G of this embodiment, balanced connection and impedance conversion can be carried out. Furthermore, with the large attenuation outside the passband, the passband characteristics can be improved.

Figure 12:
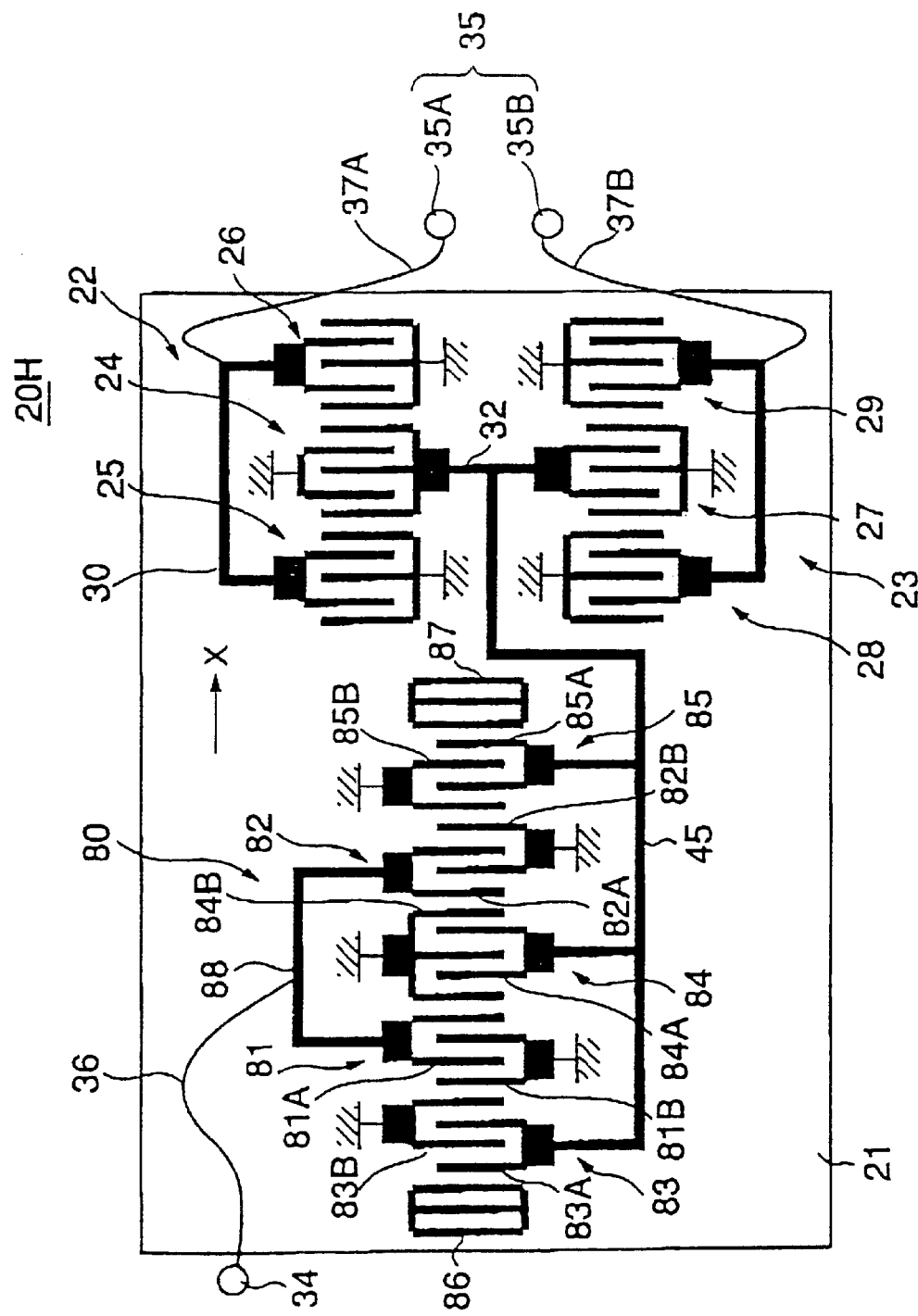
FIG. 12 shows a surface acoustic wave device of an eighth embodiment of the present invention.

FIG. 12 shows a surface acoustic wave device 20H of an eighth embodiment of the present invention. This surface acoustic wave device 20H has a structure that is similar to the surface acoustic wave device 20A of the first embodiment shown in FIG. 3, except that an IIDT (Interdigited Interdigital Transducer) filter 80 comprising five IDTs 81 to 85 is disposed on the unbalanced input terminal side.

This IIDT filter 80 comprises two reflectors 86 and 87, and the five IDTs 81 to 85 interposed between the reflectors 86 and 87. The reflectors 86 and 87, and the IDTs 81 to 85 are aligned in the propagation direction of surface acoustic waves (i.e., in the direction indicated by the arrow X in FIG. 12). As shown in FIG. 12, the IDT 81 is interposed between the IDTs 83 and 84, and the IDT 82 is interposed between the IDTs 84 and 85.

The five IDTs 81 to 85 are made up of first electrodes 81A to 85A and second electrodes 81B to 85B, respectively. Each of the electrodes has a comb-like shape. The first electrodes 83A to 85A of the IDTs 83 to 85 are connected to the second electrodes 24B and 27B of the input IDTs 24 and 27 by the connecting wire 32 and the connecting wire 45 formed as a pattern on the piezoelectric substrate 21. The second electrodes 83B to 85B are grounded.

The first electrodes 81A and 82A of the IDTs 81 and 82 are connected to each other by a connecting wire 88. This connecting wire 88 is connected to the unbalanced input terminal 34 by the input wire 36. The second electrodes 81B and 82B of the IDTs 81 and 82 are grounded.

With the IIDT filter 80 having the above structure, the attenuation outside the passband can be large, as indicated by the arrows B1 and B2 in FIG. 8. Accordingly, with the surface acoustic wave device 20H of this embodiment, balanced connection and impedance conversion can be carried out. Furthermore, with the large attenuation outside the passband, the passband characteristics can be improved. Since the IIDT filter 80 and the double-mode filter 70 exhibit excellent characteristics in difference passbands, a choice between the IIDT filter 80 and the double-mode filter 70 depends on the required passband.

Figure 13:
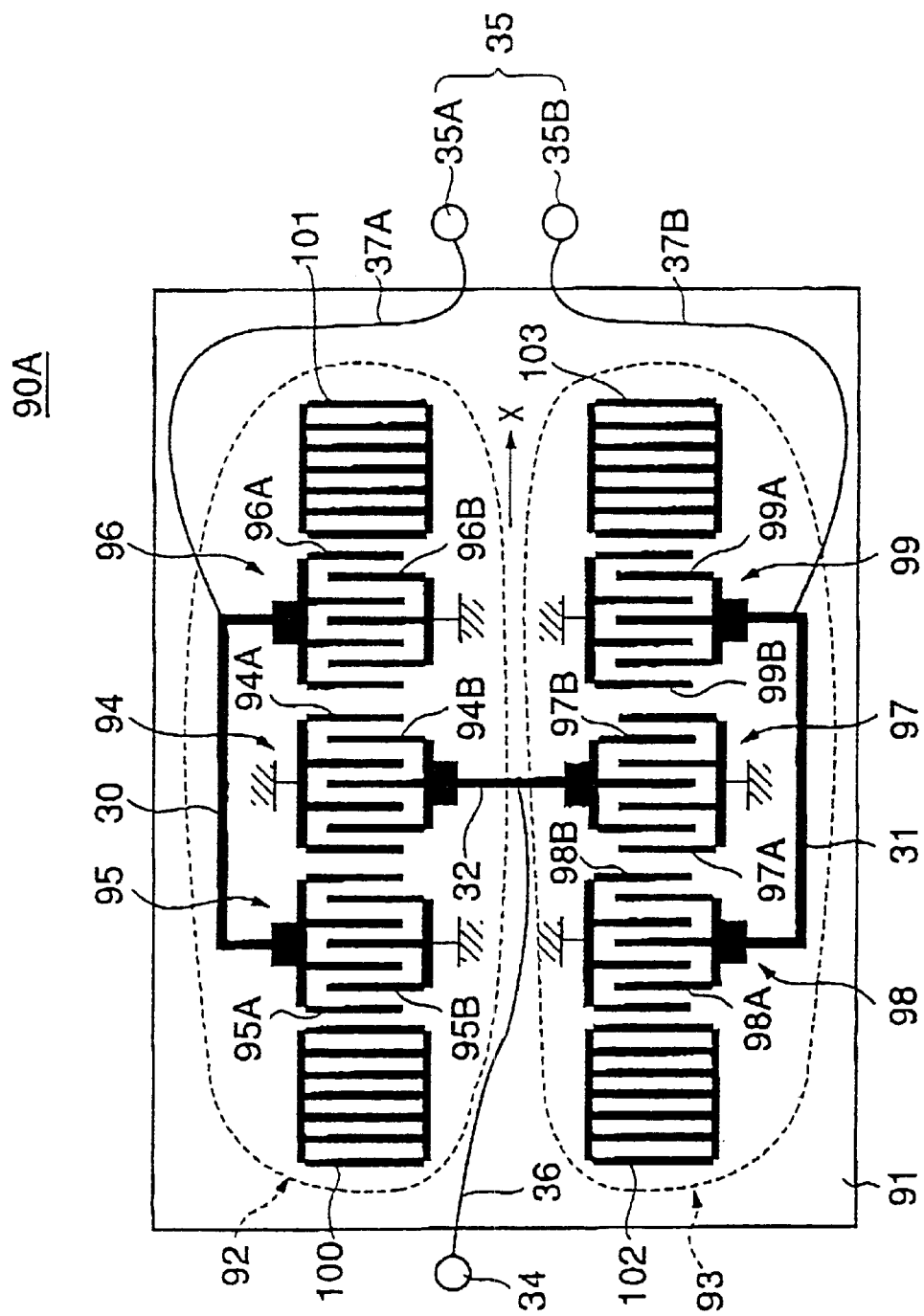
FIG. 13 shows a surface acoustic wave device of a ninth embodiment of the present invention.

FIG. 13 shows a surface acoustic wave device 90A of a ninth embodiment of the present invention. Like the surface acoustic wave device 20A of the first embodiment shown in FIG. 3, the surface acoustic wave device 90A of this embodiment has first and second surface acoustic wave filters 92 and 93 formed on a piezoelectric substrate 91. However, the surface acoustic wave device 90A differs from the surface acoustic wave device 20A in that the first and second surface acoustic wave filters 92 and 93 are double-mode filters.

The first surface acoustic wave filter 92 comprises two reflectors 100 and 101, and three IDTs 94 to 96 interposed between the reflectors 100 and 101. The reflectors 100 and 101, and the IDTs 94 to 96 are aligned in the propagation direction of surface acoustic waves (i.e., in the direction indicated by the arrow X in FIG. 13).

The three IDTs 94 to 96 are made up of first electrodes 94A to 96A and second electrodes 94B to 96B, respectively. Each of the electrodes has a comb-like shape. The second electrode 94B of the input IDT 94 is connected to the second surface acoustic wave filter 93 by the connecting wire 32 formed as a pattern on the piezoelectric substrate 91. The first electrode 94A of the input IDT 94 is grounded. The second electrodes 95B and 96B are grounded, and the first electrodes 95A and 96A are connected by the connecting wire 30.

The second surface acoustic wave filter 93 comprises two reflectors 102 and 103, and three IDTs 97 to 99 interposed between the reflectors 102 and 103. The reflectors 102 and 103, and the IDTs 97 to 99 are aligned in the propagation direction of surface acoustic waves (i.e., in the direction indicated by the arrow X in FIG. 13).

The three IDTs 97 to 99 are made up of first electrodes 97A to 99A and second electrodes 97B to 99B, respectively. Each of the electrodes has a comb-like shape. The second electrode 97B of the input IDT 97 is connected to the second electrode 94B of the input IDT 94 of the first surface acoustic wave filter 92 by the connecting wire 32. The first electrode 97A of the input IDT 97 is grounded.

The first electrodes 98A and 99A of the pair of output IDTs 98 and 99, which sandwich the input IDT 97, are connected to each other by the connecting wire 31. The second electrodes 98B and 99B of the output IDTs 98 and 99 are grounded.

The electrodes 95A, 95B, 96A, and 96B of the IDTs 95 and 96 of the first surface acoustic wave filter 92 extend in a direction opposite to a direction in which the electrodes 98A, 98B, 99A, and 99B of the IDTs 98 and 99 of the second surface acoustic filter 93 extend. Accordingly, the phase difference between the first surface acoustic filter 92 and the second surface acoustic filter 93 is approximately 180°.

In the above structure, the connecting wire 32 that electrically connects the input IDTs 94 and 97 is connected to the unbalanced input terminal 34. More specifically, one end of the input wire 36 is connected to the connecting wire 32, and the other end of the input wire 36 serves as the unbalanced input terminal 34.

Meanwhile, the first electrodes 95A and 96A of the output IDTs 95 and 96, which are not connected to the second surface acoustic wave filter 93, are connected to each other by the connecting wire 30. One end of the output wire 37A is connected to the connecting wire 30, and the other end of the output wire 37A serves as the output terminal 35A.

The first electrodes 98A and 99A of the output IDTs 98 and 99, which are not connected to the first surface acoustic wave filter 92, are connected to each other by the connecting wire 31. One end of the output wire 37B is connected to the connecting wire 31, and the other end of the output wire 37B serves as the output terminal 35B. The output terminal 35A (balanced terminal 35A) extending from the first surface acoustic wave filter 92 and the output terminal 35B (balanced terminal 35B) extending from the second surface acoustic wave filter 93 constitute the balanced terminal 35.

If the surface acoustic wave device 90A of this embodiment is employed in a portable telephone device having a balanced mixer IC, for instance, a circuit or component that has been conventionally required for unbalance-to-balance conversion is no longer required, thereby reducing the number of components, the size, the weight, and the cost of the portable telephone.

The surface acoustic wave device 90A of this embodiment is equivalent to the circuit diagram shown in FIG. 4. Accordingly, the impedance ($R_{IN}$) of the unbalanced input terminal 34 is approximately one half of the impedance of each of the first and second surface acoustic wave filters 92 and 93 ($R_{IN} \approx R1/2$), and the impedance of the balanced terminals 35A and 35B ($R_{OUT}$) is approximately twice the output impedance of each of the first and second surface acoustic wave filters 92 and 93 ($R_{OUT} \approx 2 \times R2$). If the input impedance and the output impedance of each of the first and second surface acoustic wave filters 92 and 93 are equal (i.e., R1=R2), the impedance of the balanced terminals 35A and 35B ($R_{OUT}$) is approximately four times as high as the impedance ($R_{IN}$) of the unbalanced input terminal 34 ($R_{OUT} \approx 4 \times R_{IN}$). This proves that impedance conversion is carried out in the surface acoustic wave device 90A of this embodiment. Accordingly, there is no need to employ a circuit or component that carries out impedance conversion, even if the input impedance of the surface acoustic wave device 90A is different from the impedance of an electronic part (such as the balanced mixer IC 5A shown in FIG. 2) connected to the surface acoustic wave device 90A. Thus, the number of components, the size, the weight, and the cost of an electronic apparatus to which the surface acoustic wave device 90A is mounted can be reduced.

As described above, since the first and second surface acoustic wave filters 92 and 93 are double-mode filters, the attenuation outside the passband can be large. Accordingly, with the surface acoustic wave device 90A of this embodiment, balanced connection and impedance conversion can be carried out. Furthermore, because of the large attenuation outside the passband, the passband characteristics can be improved.

Figure 14:
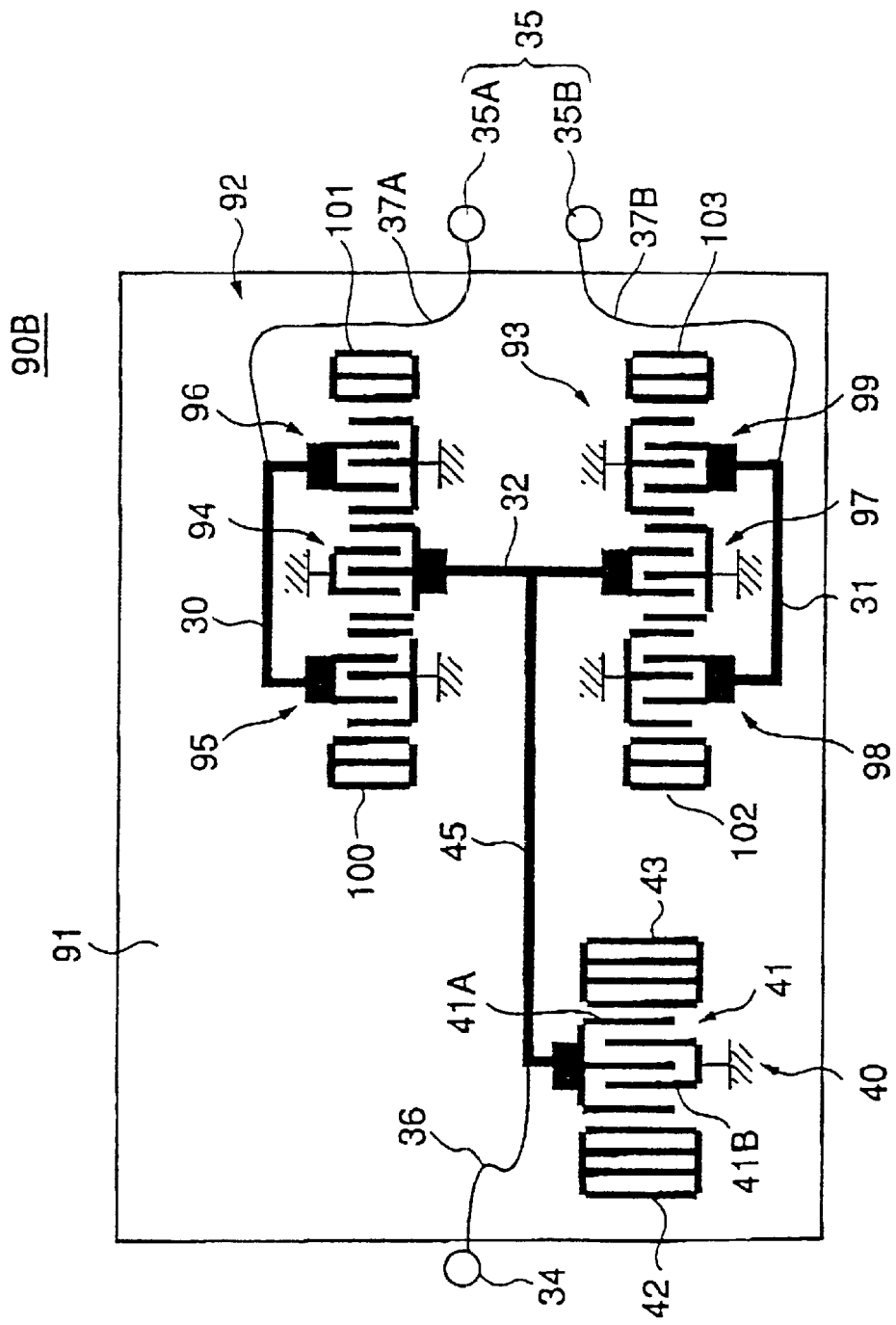
FIG. 14 shows a surface acoustic wave device of a tenth embodiment of the present invention.

FIG. 14 shows a surface acoustic wave device 90B of a tenth embodiment of the present invention. In FIGS. 14 and the following figures, the same components as in FIGS. 3 and 13 are denoted by the same reference numerals, and explanations for those components are omitted.

This surface acoustic wave device 90B has a structure similar to the surface acoustic wave device 90A of the ninth embodiment shown in FIG. 13, except that the surface acoustic wave parallel resonator 40 is disposed on the unbalanced input terminal side.

As described above, since the first and second surface acoustic wave filters 92 and 93 are double-mode filters, the attenuation outside the passband can be large. Also, with the surface acoustic wave parallel resonator 40, the attenuation side suddenly drops in the vicinity of the passband on the low-frequency side. Accordingly, with the surface acoustic wave device 90B of this embodiment, balanced connection and impedance conversion can be carried out. Furthermore, the attenuation outside the passband can be increased, and the passband characteristics can be improved on the low-frequency side.

Figure 15:
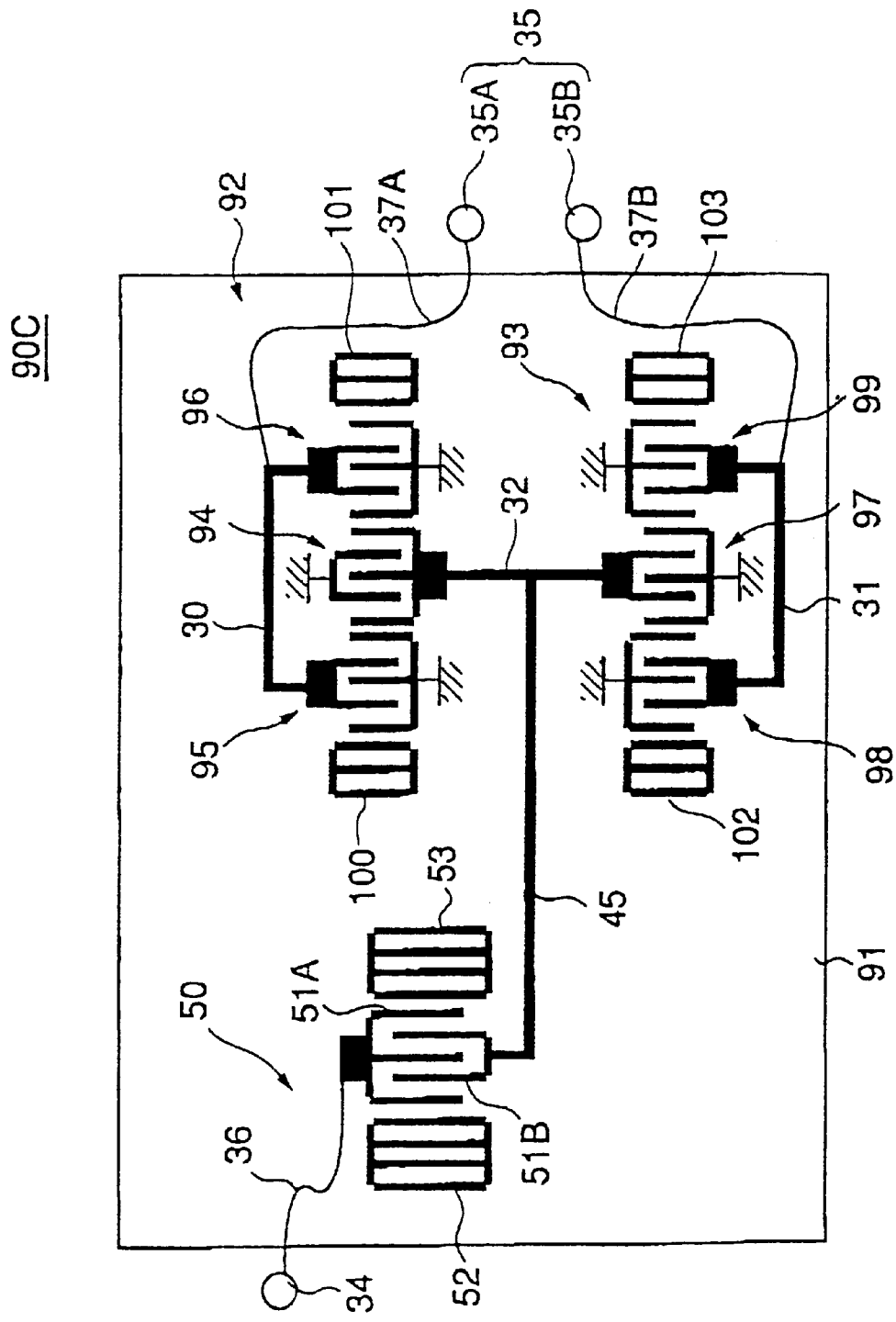
FIG. 15 shows a surface acoustic wave device of an eleventh embodiment of the present invention.

FIG. 15 shows a surface acoustic wave device 90C of an eleventh embodiment of the present invention. This surface acoustic wave device 90C also has a structure that is similar to the surface acoustic wave device 90A of the ninth embodiment shown in FIG. 13, except that the surface acoustic wave series resonator 50 is disposed on the unbalanced input terminal side.

Since the first and second surface acoustic wave filters 92 and 93 are double-mode filters in this embodiment, the attenuation outside the passband can be large. Also, with the surface acoustic wave series resonator 50, the attenuation suddenly drops in the vicinity of the passband on the high-frequency side. Accordingly, with the surface acoustic wave device 90C, balanced connection and impedance conversion can be carried out. Furthermore, the attenuation outside the passband can be increased, and the passband characteristics on the high-frequency side can be improved.

Figure 16:
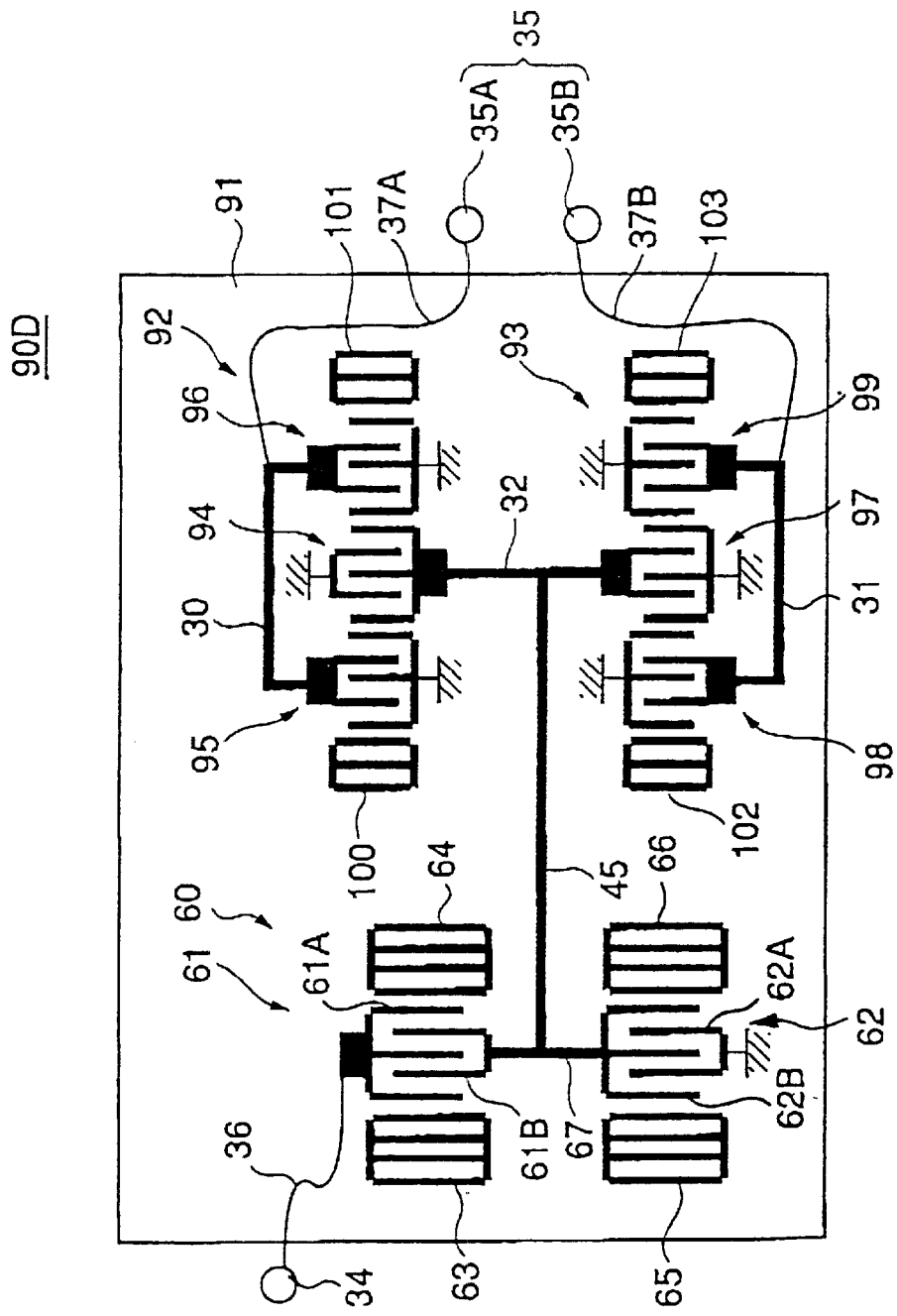
FIG. 16 shows a surface acoustic wave device of a twelfth embodiment of the present invention.

FIG. 16 shows a surface acoustic wave device 90D of a twelfth embodiment of the present invention. This surface acoustic wave device 90D also has a structure that is similar to the surface acoustic wave device 90A of the ninth embodiment shown in FIG. 13, except that the ladder-type filter 60 is disposed on the unbalanced input terminal side.

Since the first and second surface acoustic wave filters 92 and 93 are double-mode filters, the attenuation outside the passband can be made large. Also, with the ladder-type filter 60, the attenuation suddenly drops near the passband both on the high-frequency side and the low-frequency side. Accordingly, with the surface acoustic wave device 90D of this embodiment, balanced connection and impedance conversion can be carried out. Furthermore, the attenuation outside the passband can be increased, and the passband characteristics can be improved both on the high-frequency side and the low-frequency side.

Figure 17:
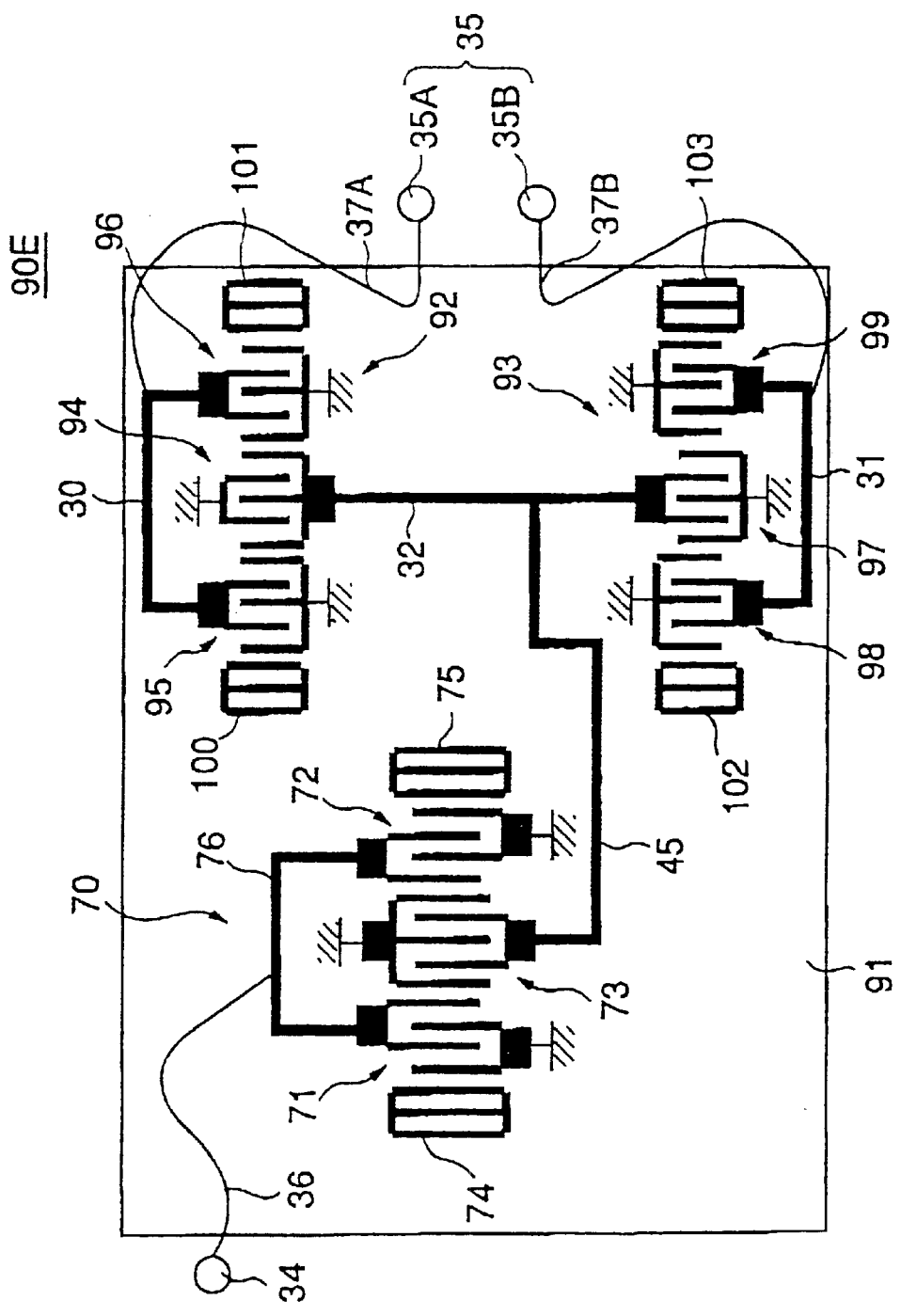
FIG. 17 shows a surface acoustic wave device of a thirteenth embodiment of the present invention.

FIG. 17 shows a surface acoustic wave device 90E of a thirteenth embodiment of the present invention. This surface acoustic wave device 90E also has a structure that is similar to the surface acoustic wave device 90A of the ninth embodiment shown in FIG. 13, except that the double-mode filter 70 including the three IDTs 71 to 73 interposed between the two reflectors 74 and 75 is disposed on the unbalanced input terminal side.

Since the first and second surface acoustic wave filters 92 and 93 are double-mode filters in this embodiment, the attenuation outside the passband can be made large. Also, with the double-mode filter 70, the attenuation outside the passband can be made even larger. Accordingly, with the surface acoustic wave device 90E of this embodiment, balanced connection and impedance conversion can be carried out. Furthermore, the attenuation outside the passband can be more securely maintained.

Figure 18:
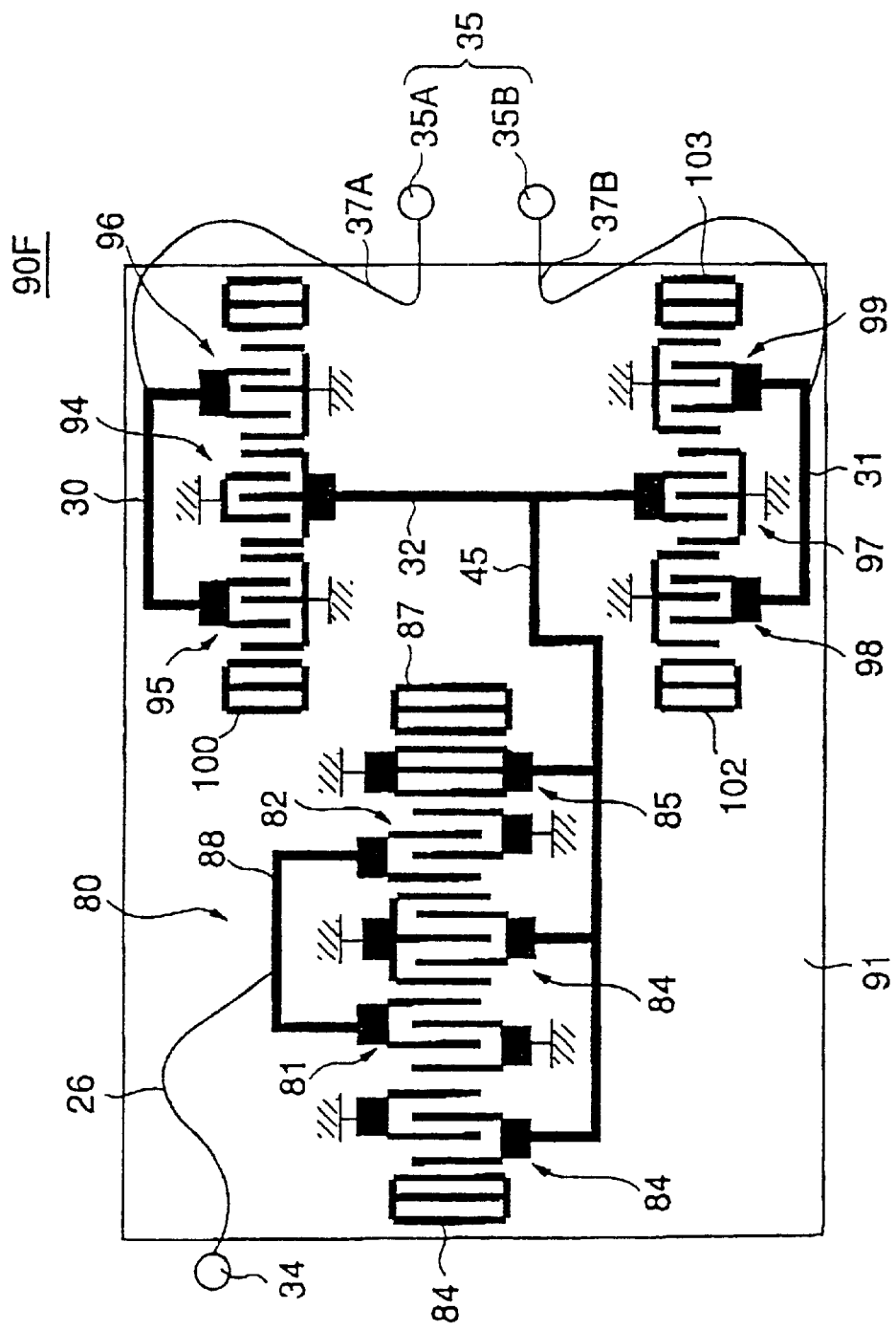
FIG. 18 shows a surface acoustic wave device of a fourteenth embodiment of the present invention.

FIG. 18 shows a surface acoustic wave device 90F of a fourteenth embodiment of the present invention. This surface acoustic wave device 90F also has a structure that is similar to the surface acoustic wave device 90A of the ninth embodiment shown in FIG. 13, except that the IIDT filter 80 having the five IDTs 81 to 85 is disposed on the unbalanced input terminal side.

Since the first and second surface acoustic wave filters 92 and 93 are double-mode filters in this embodiment, the attenuation outside the passband can be made large. Also, with the IIDT filter 80, the attenuation outside the passband can be made even larger. Accordingly, with the surface acoustic wave device 90F of this embodiment, balanced connection and impedance conversion can be carried out. Furthermore, the attenuation outside the passband can be more securely maintained.

Figure 19:
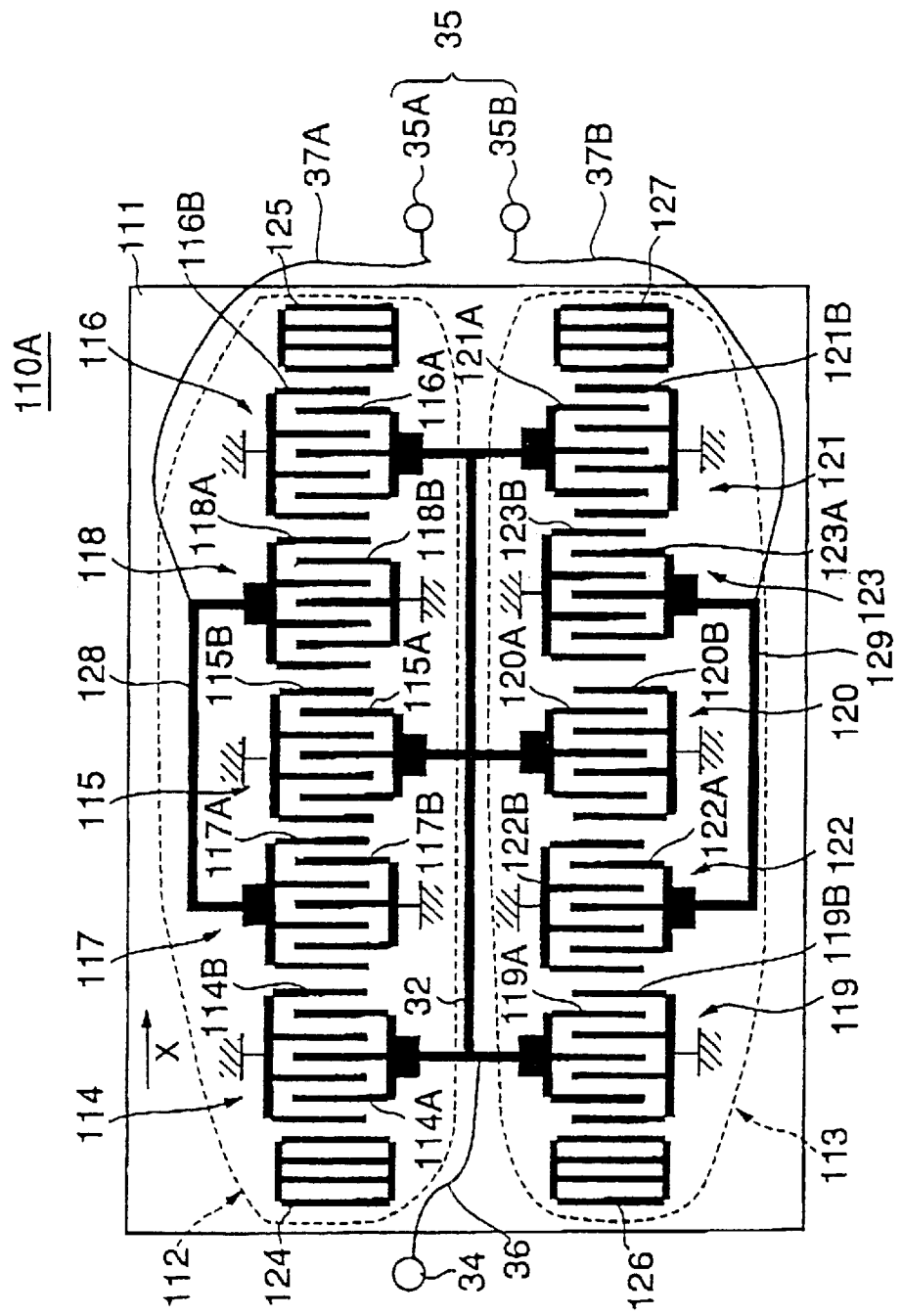
FIG. 19 shows a surface acoustic wave device of a fifteenth embodiment of the present invention.

FIG. 19 shows a surface acoustic wave device 110A of a fifteenth embodiment of the present invention. Like the surface acoustic wave device 20A of the first embodiment shown in FIG. 3, the surface acoustic wave device 110A of this embodiment has a first surface acoustic wave filter 112 and a second surface acoustic wave filter 113 both formed on a piezoelectric substrate 111. The surface acoustic wave device 110A of this embodiment differs from the surface acoustic wave device 20A of the first embodiment in that the first and second surface acoustic wave filters 112 and 113 are IIDT filters.

The first surface acoustic wave filter 112 comprises two reflectors 124 and 125, and five IDTs 114 to 118 interposed between the reflectors 124 and 125. The reflectors 124 and 125, and the IDTs 114 to 118 are aligned in the propagation direction of surface acoustic waves (i.e., the direction indicated by the arrow X in FIG. 19).

The five IDTs 114 to 118 are made up of first electrodes 114A to 118A and second electrodes 114B to 118B, respectively. Each of the electrodes has a comb-like shape. The first electrodes 114A to 116A of the three input IDTs 114 to 116 are connected to one another by the connecting wire 32 formed as a pattern on the piezoelectric substrate 111. The first electrodes 114A to 116A are also connected to the second surface acoustic wave filter 113. The second electrodes 114B to 116B of the input IDTs 114 to 116 are grounded. The first electrodes 117 and 118A of the output IDTs 117 and 118 are connected to each other by a connecting wire 128, while the second electrodes 117B and 118B of the output IDTs 117 and 118 are grounded.

Meanwhile, the second surface acoustic wave filter 113 comprises two reflectors 126 and 127, and five IDTs 119 to 123 interposed between the reflectors 126 and 127. The reflectors 126 and 127, and the IDTs 119 to 123 are aligned in the propagation direction of surface acoustic waves (i.e., the direction indicated by the arrow X in FIG. 19).

The five IDTs 119 to 123 are made up of first electrodes 119A to 123A and second electrodes 119B to 123B, respectively. Each of the electrodes has a comb-like shape. The first electrodes 119A to 121A of the three input IDTs 119 to 121 are connected to the one another by the connecting wire 32, and to the first electrodes 114A to 116A of the input IDTs 114 to 116 of the first surface acoustic wave filter 112.

The second electrodes 119B to 121B of the input IDTs 119 to 121 are grounded. The first electrodes 122A and 123A of the output IDTs 122 and 123 are connected to each other by a connecting wire 129, and the second electrodes 122B and 123B of the output IDTS 122 and 123 are grounded.

The electrodes 117A, 117B, 118A, and 118B of the IDTs 117 and 118 of the first surface acoustic wave filter 112 extend in a direction opposite to a direction of the electrodes 122A, 122B, 123A, and 123B of the IDTs 122 and 123 of the second surface acoustic wave filter 113. Accordingly, the phase difference between the first surface acoustic wave filter 112 and the second surface acoustic wave filter 113 is approximately 180°.

In the above structure, the connecting wire 32, which electrically connects the first electrodes 114A–116A and 119A–121A of the input IDTs 114–116 and 119–121 to one another, is connected to the unbalanced input terminal 34. More specifically, one end of the input wire 36 is connected to the connecting wire 32, and the other end of the input wire 36 serves as the unbalanced input terminal 34.

The first electrodes 117A and 118A of the output IDTs 117 and 118, which are not connected to the second surface acoustic wave filter 113, are connected to each other by a connecting wire 128. One end of the output wire 37A is connected to the connecting wire 128, and the other end of the output wire 37A serves as the output terminal 35A.

The first electrodes 122A and 123A of the output IDTs 122 and 123, which are not connected to the first surface acoustic filter 112, are connected to each other by a connecting wire 129. One end of the output wire 37B is connected to the connecting wire 129, and the other end of the output wire 37B serves as the output terminal 35B. In this manner, the output terminal 35A (balanced terminal 35A) extending from the first surface acoustic wave filter 112 and the output terminal 35B (balanced terminal 35B) extending from the second surface acoustic wave filter 113 constitute the balanced terminal 35.

If the surface acoustic wave device 110A of this embodiment is employed in a portable telephone having a balanced mixer IC, a circuit or component that has been conventionally required for unbalance-to-balance conversion is no longer required, thereby reducing the number of components, the size, the weight, the cost of the portable telephone.

The surface acoustic wave device 110A of this embodiment is also equivalent to the circuit shown in FIG. 4. Accordingly, the impedance ($R_{IN}$) of the unbalanced input terminal 34 is approximately one half of the impedance of the surface acoustic wave filters 112 and 113 ($R_{IN} \approx R1/2$), and the impedance ($R_{OUT}$) of the balanced terminals 35A and 35B is approximately twice as high as the output impedance of the surface acoustic wave filters ($R_{OUT} \approx 2 \times R2$). Accordingly, if the input impedance and the output impedance of the first and second surface acoustic wave filters 112 and 113 are equal (i.e., R1=R2), the impedance ($R_{OUT}$) of the balanced terminals 35A and 35B becomes approximately four times as high as the impedance ($R_{IN}$) of the unbalanced input terminal 34 ($R_{OUT} \approx 4 \times R_{IN}$). In this manner, impedance conversion is carried out in the surface acoustic wave device 110A of this embodiment.

Accordingly, there is no need to employ a circuit or component that carries out impedance conversion, even if the input impedance of the surface acoustic wave device 110A is different from the impedance of an electronic part (such as the balanced mixer IC 5A shown in FIG. 2) connected to the surface acoustic wave device 110A. Thus, the number of components, the size, the weight, and the cost of the electronic device can be reduced.

As described above, since the first and second surface acoustic wave filters 112 and 113 are IIDT filters, the attenuation outside the passband can be made large. Accordingly, with the surface acoustic wave device 110A of this embodiment, balanced connection and impedance conversion can be carried out. Furthermore, the attenuation outside the passband can be increased, and the passband characteristics can be improved.

Figure 20:
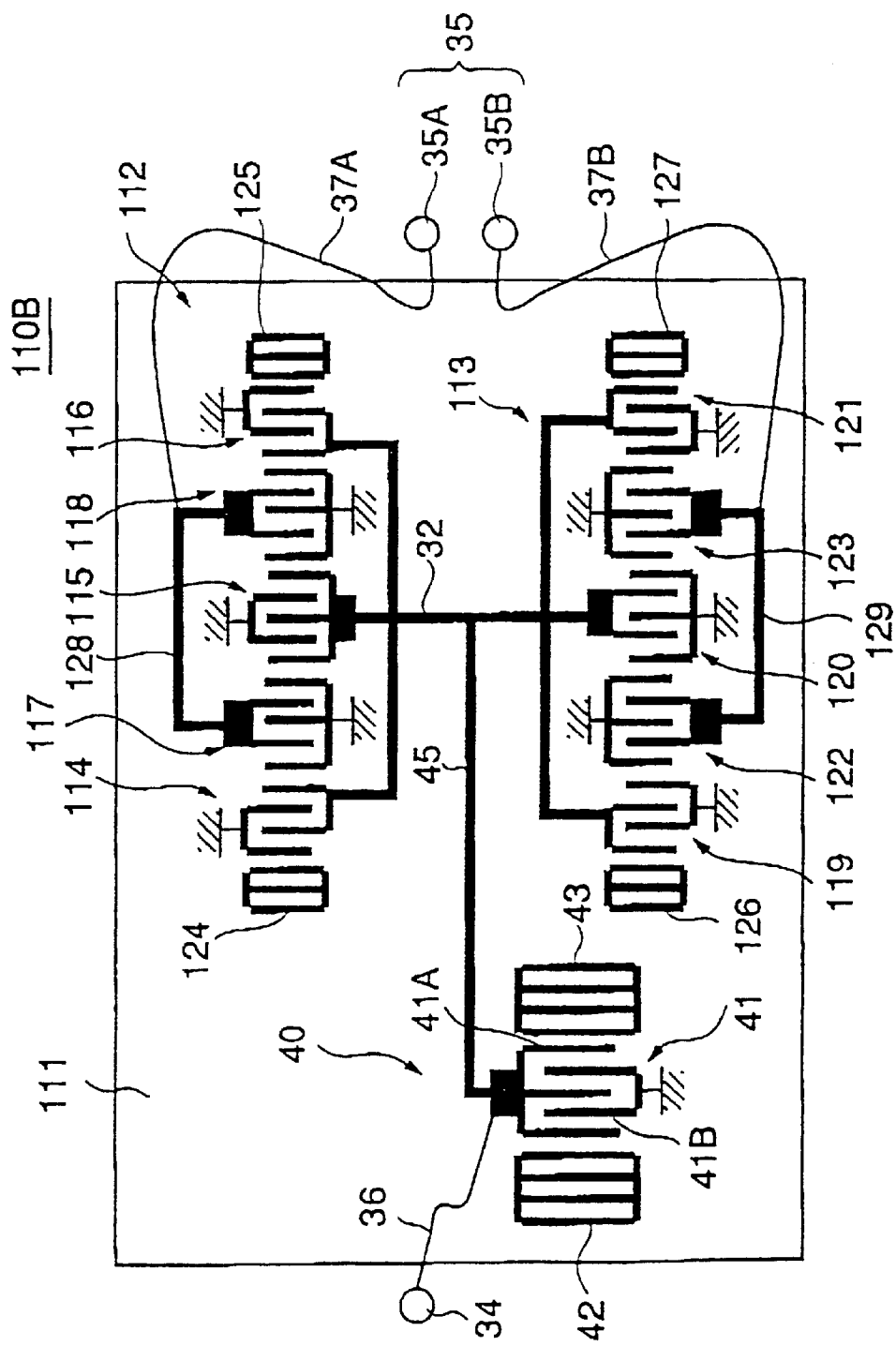
FIG. 20 shows a surface acoustic wave device of a sixteenth embodiment of the present invention.

FIG. 20 shows a surface acoustic wave device 110B of a sixteenth embodiment of the present invention. This surface acoustic wave device 110B has a structure that is similar to the surface acoustic wave device 110A of the fifteenth embodiment shown in FIG. 19, except that the surface acoustic wave parallel resonator 40 is disposed on the unbalanced input terminal side.

As described above, since the first and second surface acoustic wave filters 112 and 113 are IIDT filters, the attenuation outside the passband can be made large. Also, with the surface acoustic wave parallel resonator 40, the attenuation suddenly drops in the vicinity of the passband on the low-frequency side. Accordingly, with the surface acoustic wave device 110B of this embodiment, balanced connection and impedance conversion can be carried out. Furthermore, the attenuation outside the passband can be increased, and the passband characteristics can be improved on the low-frequency side.

Figure 21:
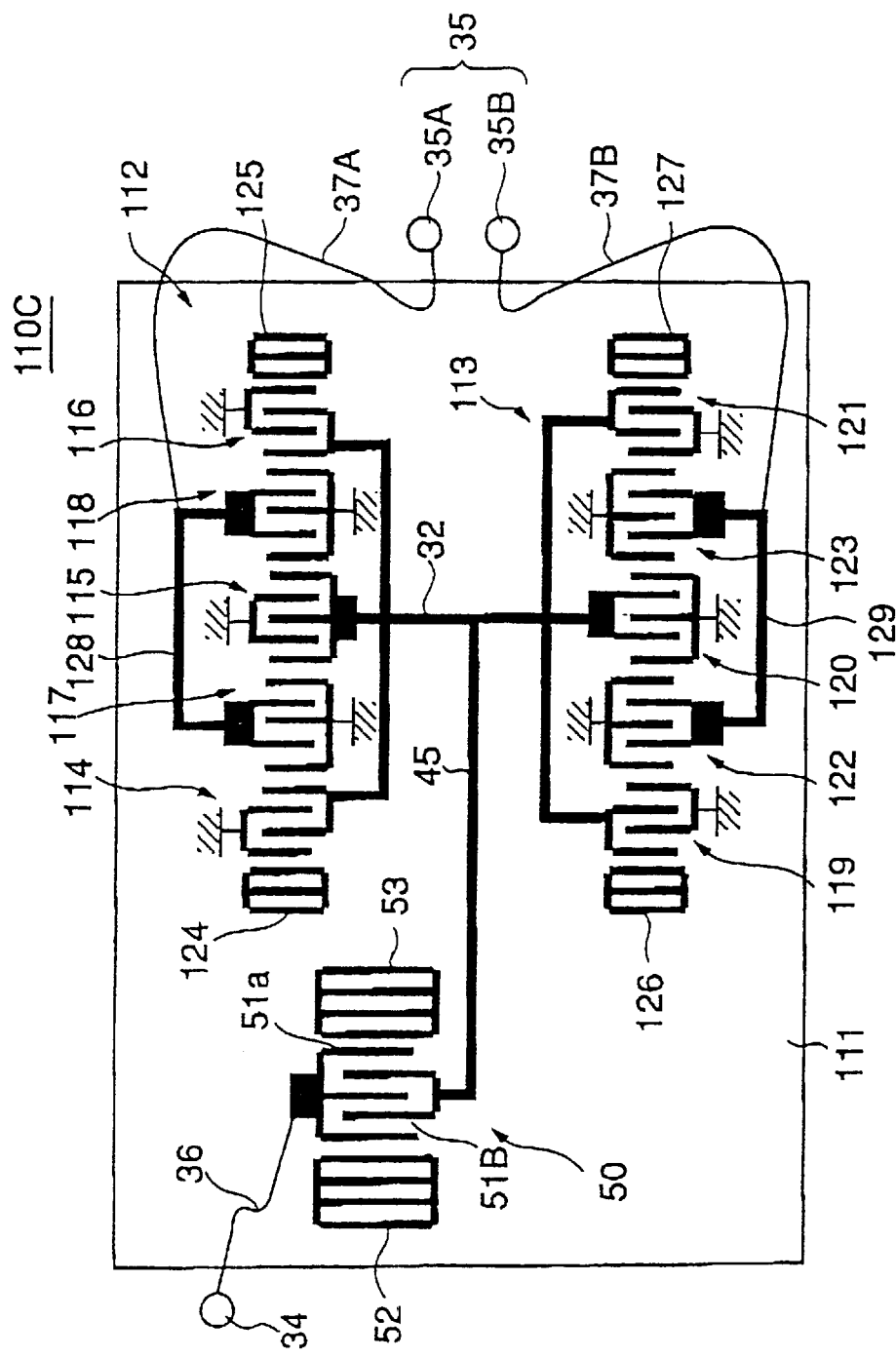
FIG. 21 shows a surface acoustic wave device of a seventeenth embodiment of the present invention.

FIG. 21 shows a surface acoustic wave device 110C of a seventeenth embodiment of the present invention. This surface acoustic wave device 110C also has a structure that is similar to the surface acoustic wave device 110A of the fifteenth embodiment shown in FIG. 19, except that the surface acoustic wave series resonator 50 is disposed on the unbalanced input terminal side.

As described above, since the first and second surface acoustic wave filters 112 and 113 are IIDT filters, the attenuation outside the passband can be made large. Also, with the surface acoustic wave series resonator 50, the attenuation suddenly drops in the vicinity of the passband on the high-frequency side. Accordingly, with the surface acoustic wave device 110C of this embodiment, balanced connection and impedance conversion can be carried out. Furthermore, the attenuation outside the passband can be increased, and the passband characteristics can be improved on the high-frequency side.

Figure 22:
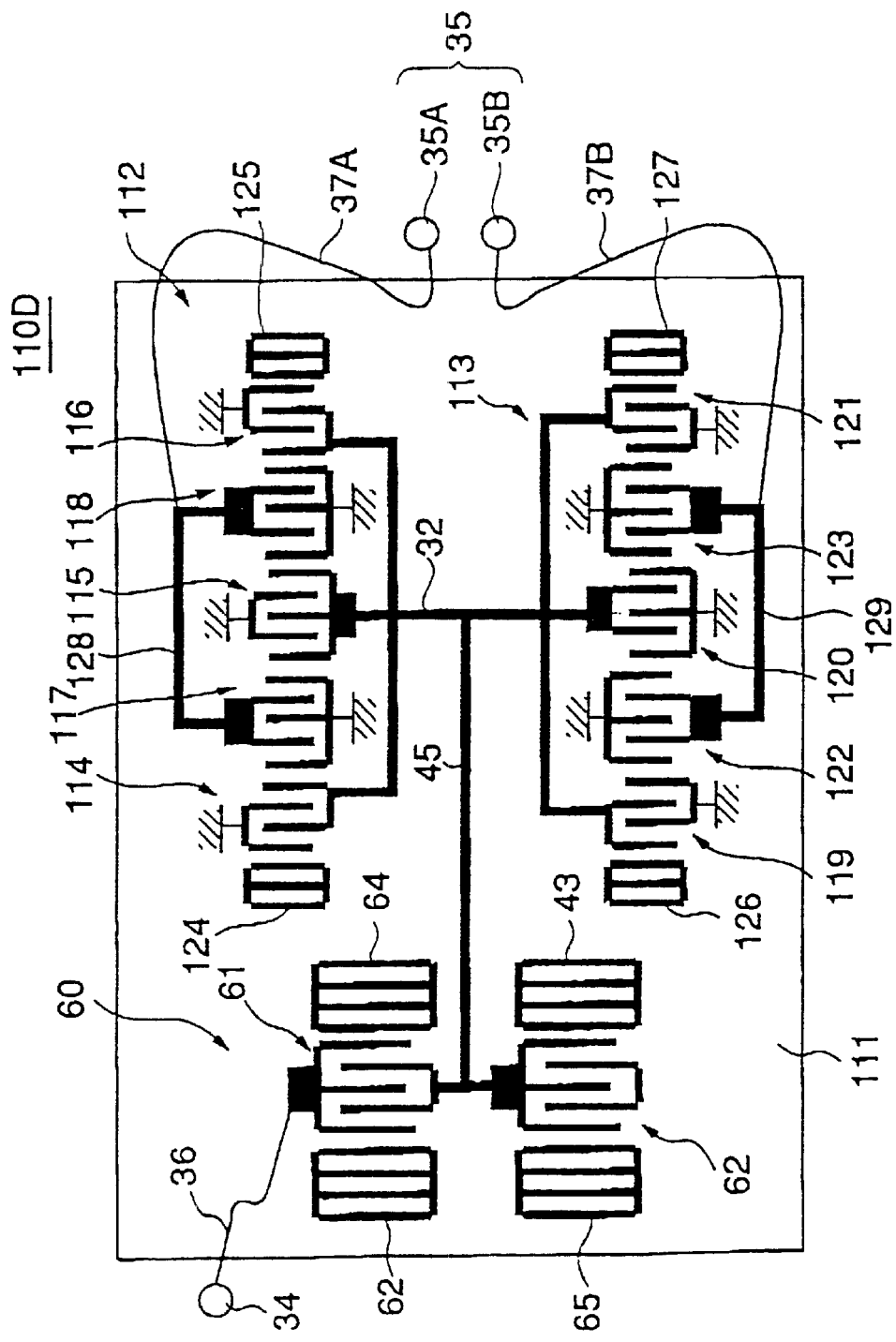
FIG. 22 shows a surface acoustic wave device of an eighteenth embodiment of the present invention.

FIG. 22 shows a surface acoustic wave device 110D of an eighteenth embodiment of the present invention. This surface acoustic wave device 110D also has a structure that is similar to the surface acoustic wave device 110A of the fifteenth embodiment shown in FIG. 19, except that the ladder-type filter 60 is disposed on the unbalanced input terminal side.

As described above, since the first and second surface acoustic wave filters 112 and 113 are IIDT filters, the attenuation outside the passband can be made large. Also, with the ladder-type filter 60, the attenuation suddenly drops in the vicinity of the passband on both the high- and low-frequency sides. Accordingly, with the surface acoustic wave device 110D of this embodiment, balanced connection and impedance conversion can be carried out. Furthermore, the attenuation outside the passband can be increased, and the passband characteristics can be improved on both the high- and low-frequency sides.

Figure 23:
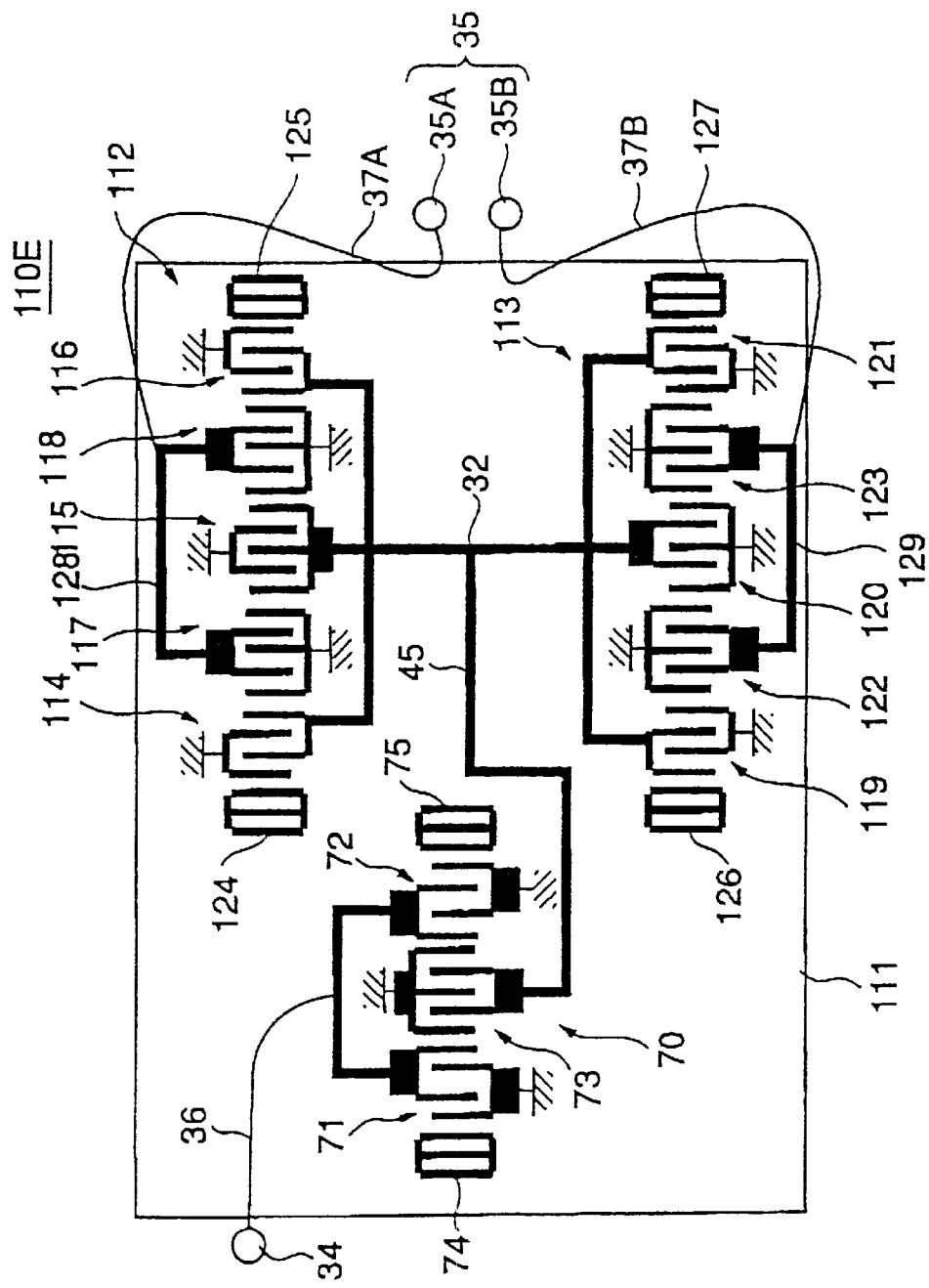
FIG. 23 shows a surface acoustic wave device of a nineteenth embodiment of the present invention.

FIG. 23 shows a surface acoustic wave device 110E of a nineteenth embodiment of the present invention. This surface acoustic wave device 110E also has a structure that is similar to the surface acoustic wave device 110A of the fifteenth embodiment shown in FIG. 19, except that the double-mode filter 70 is disposed on the unbalanced input terminal side.

As described above, since the first and second surface acoustic wave filters 112 and 113 are IIDT filters, the attenuation outside the passband can be made large. Also, with the double-mode filter 70, the attenuation outside the passband can be made even larger. Accordingly, with the surface acoustic wave device 110E of this embodiment, balanced connection and impedance conversion can be carried out. Furthermore, the attenuation outside the passband can be more securely maintained.

Figure 24:
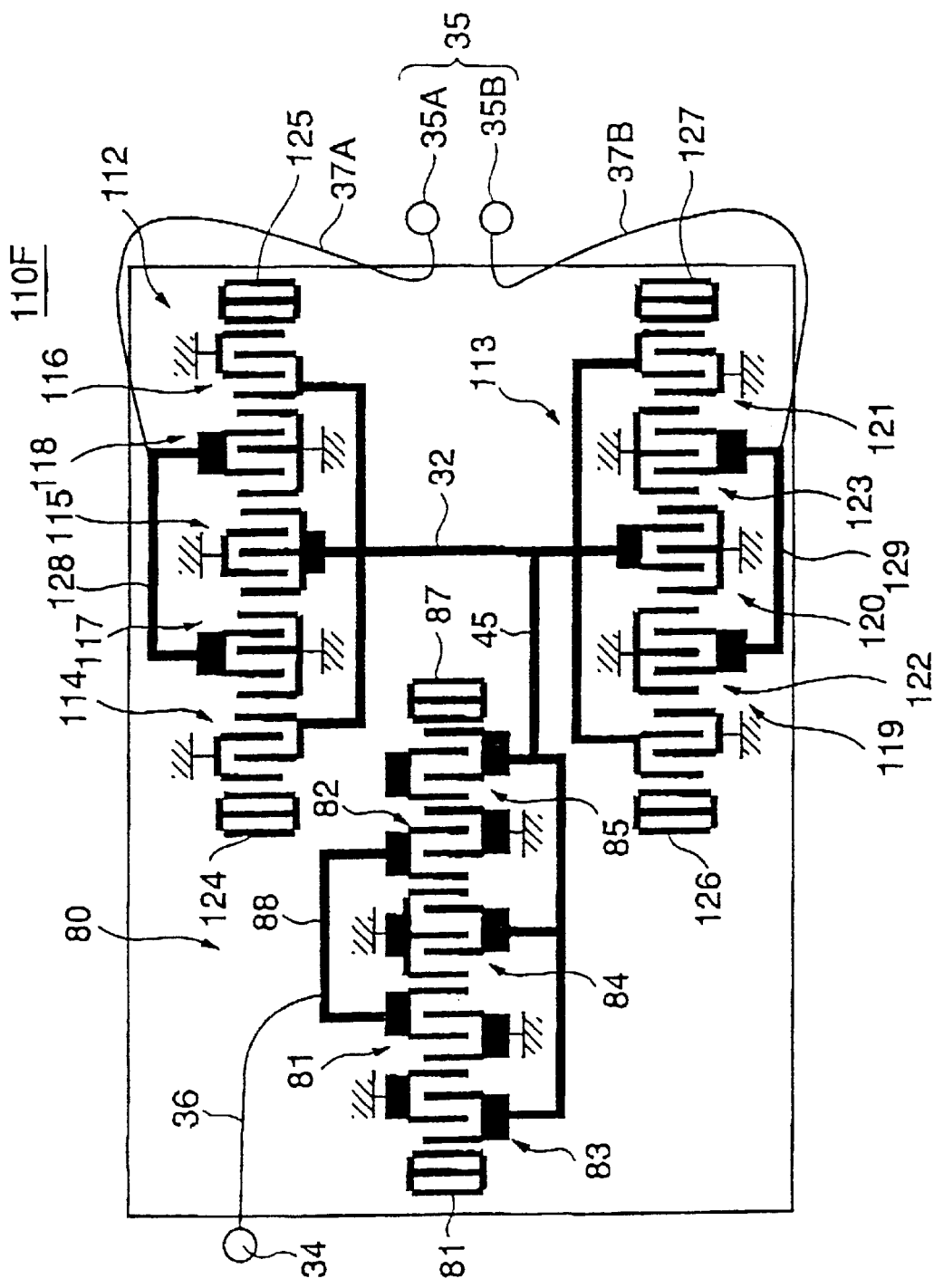
FIG. 24 shows a surface acoustic wave device of a twentieth embodiment of the present invention.

FIG. 24 shows a surface acoustic wave device 110F of a twentieth embodiment of the present invention. This surface acoustic wave device 110F also has a structure that is similar to the surface acoustic wave device 110A of the fifteenth embodiment shown in FIG. 19, except that the IIDT filter 80 is disposed on the unbalanced input terminal side.

As described above, since the first and second surface acoustic wave filters 112 and 113 are IIDT filters, the attenuation outside the passband can be made large. Also, with the IIDT filter 80, the attenuation outside the passband can be made even larger. Accordingly, with the surface acoustic wave device 110F of this embodiment, balanced connection and impedance conversion can be carried out. Furthermore, the attenuation outside the passband can be more securely maintained.

Figure 25:
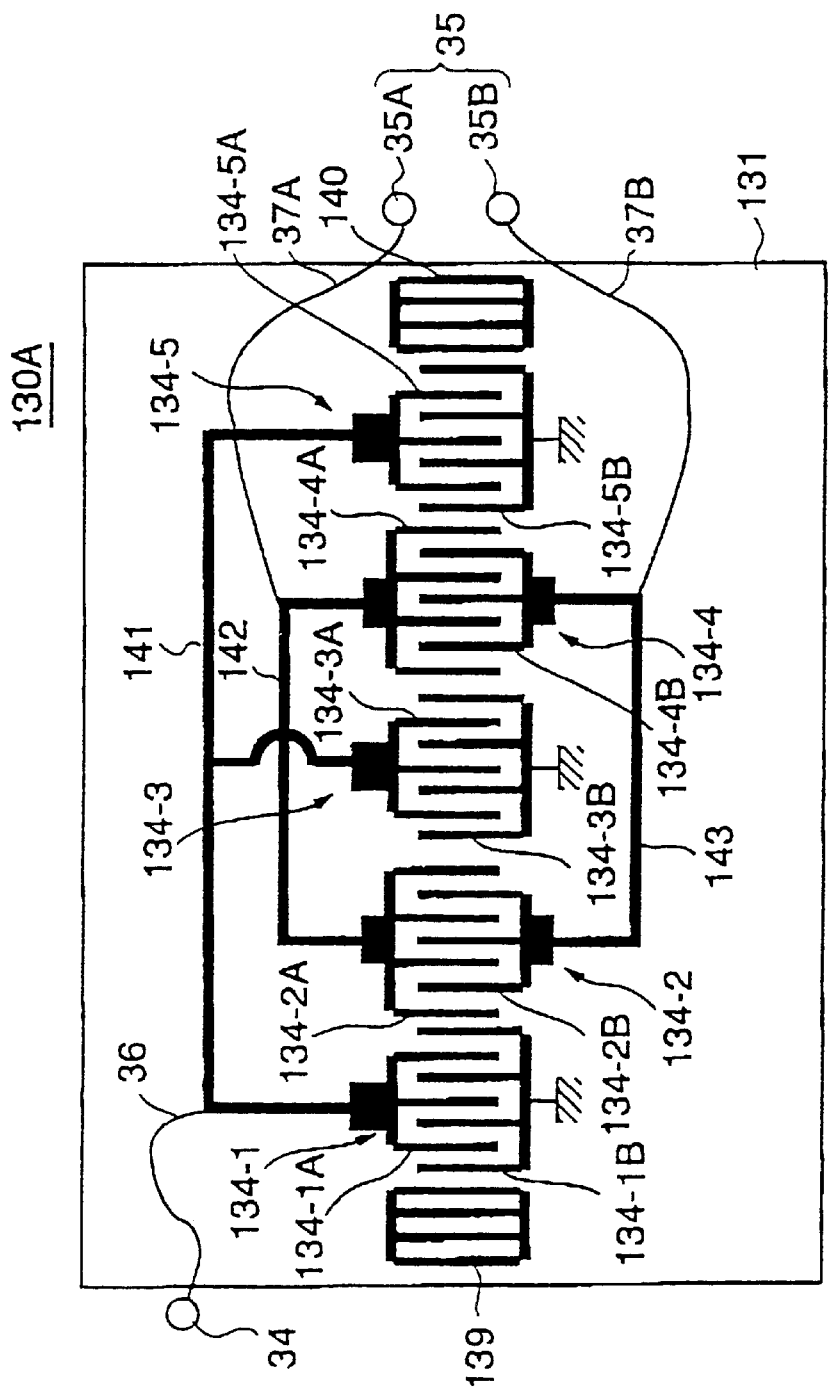
FIG. 25 shows a surface acoustic wave device of a twenty-first embodiment of the present invention.

FIG. 25 shows a surface acoustic wave device 130A of a twenty-first embodiment of the present invention. This surface acoustic wave device 130A comprises a piezoelectric substrate 131, five IDTs 134-1 to 134-5 formed on the propagation paths of surface acoustic waves on the piezoelectric substrate 131, and a pair of reflectors 139 and 140 that sandwich the IDTs 134-1 to 134-5.

The five IDTs 134-1 to 134-5 are made up of first electrodes 134-1A to 134-5A and second electrodes 134-1B to 134-5B, respectively. Each of the electrodes has a comb-like shape. Among the five IDTs 134-1 to 134-5, the IDTs 134-1, 134-3, and 134-5 are input IDTs, while the IDTs 134-2 and 134-4 are output IDTs. The output IDT 134-2 is interposed between the input IDTs 134-1 and 134-3, and the output IDT 134-4 is interposed between the input IDTs 134-3 and 134-5. The first electrodes 134-1A, 134-3A, and 134-5A of the input IDTs 134-1, 134-3, and 134-5 are connected to one another by a connecting wire 141 formed as a pattern on the piezoelectric substrate 131. The second electrodes 134-1B, 134-3B, and 134-5B of the input IDTs 134-1, 134-3, and 134-5 are grounded.

On the other hand, the first electrodes 134-2A and 134-4A of the output IDTs 134-2 and 134-4 are connected to each other by a connecting wire 142. The second electrodes 134-2B and 134-4B of the output IDTs 134-2 and 134-4 are connected by a connecting wire 143.

In the above structure, the connecting wire 141, which electrically connects the first electrodes 134-1A, 134-3A, and 134-5A of the input IDTs 134-1, 134-3, and 134-5, is connected to the unbalanced input terminal 34. More specifically, one end of the input wire 36 is connected to the connecting wire 141, and the other end of the input wire 36 serves as the unbalanced input terminal 34.

The first electrodes 134-2A and 134-4A of the output IDTs 134-2 and 134-4 are connected to each other by the connecting wire 142. One end of the output wire 37A is connected to the connecting wire 142, and the other end of the output wire 37A serves as the output terminal 35A. The second electrodes 134-2B and 134-4B of the output IDTs 134-2 and 134-4 are connected to each other by the connecting wire 143. One end of the output wire 37B is connected to the connecting wire 143, and the other end of the output wire 37B serves as the output terminal 35B.

The phase difference between the first electrodes 134-2A, 134-4A and the second electrodes 134-2B, 134-4B is 180°. Accordingly, the output terminal 35A (balanced terminal 35A) extending from the first electrodes 134-2A and 134-4A of the output IDTs 134-2 and 134-4, and the output terminal 35B (balanced terminal 35B) extending from the second electrodes 134-2B and 134-4B of the output IDTs 134-2 and 134-4 constitute the balanced terminal 35.

If the surface acoustic wave device 130A of this embodiment is employed in a portable telephone having a balanced mixer IC, a circuit or component that has been conventionally required for unbalance-to-balance conversion is no longer required, thereby reducing the number of components, the size, the weight, the cost of the portable telephone. The surface acoustic wave device 130A including the five IDTs 134-1 to 134-5 (Hereinafter, this type of surface acoustic wave filter will be referred to as "5-IDT filter".) can obtain stable characteristics in a wide passband. Furthermore, since the input and output IDTs 134-1 to 134-5 are all arranged in parallel, the impedance of the entire surface acoustic wave device 130A can be lowered.

When an electronic part (such as the balanced mixer IC 5B shown in FIG. 2) having a different impedance is connected to the surface acoustic wave device 130A of this embodiment, the problem of impedance matching will be caused. However, impedance matching can be easily carried out by connecting one or more resonators and filters to the balanced terminal 35 or the unbalanced input terminal 34 on the piezoelectric substrate 131 of the surface acoustic wave device 130A. The following embodiments will show examples of such a structure.

Figure 26:
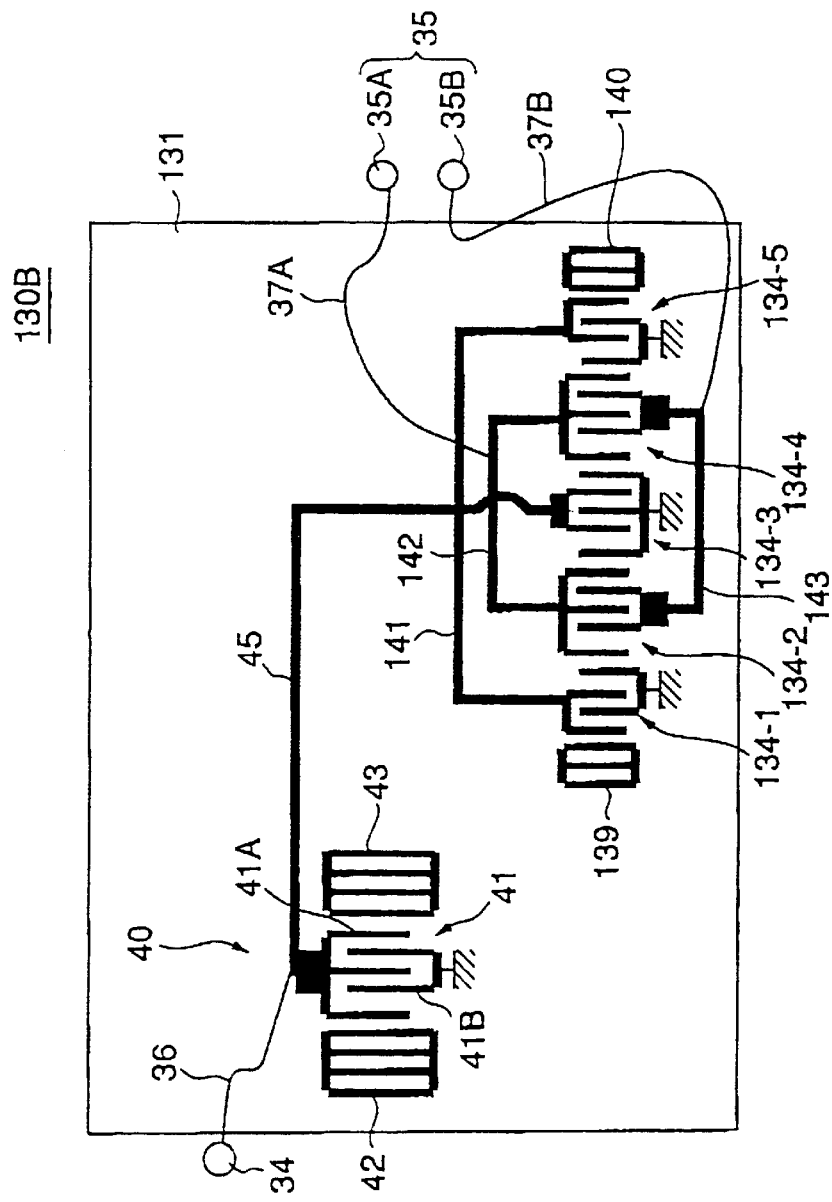
FIG. 26 shows a surface acoustic wave device of a twenty-second embodiment of the present invention.

FIG. 26 shows a surface acoustic wave device 130B of a twenty-second embodiment of the present invention. In FIG. 26 and the following figures, the same components as in FIGS. 3, 13, and 25 are denoted by the same reference numerals, and explanations for those components are omitted.

This surface acoustic wave device 130B has a structure that is similar to the surface acoustic wave device 130A of the twenty-first embodiment shown in FIG. 25, except that the surface acoustic wave parallel resonator 40 is disposed on the unbalanced input terminal side.

As described above, with the 5-IDT filter, stable characteristics can be obtained in a wide passband. Also, since the surface acoustic wave parallel resonator 40 is disposed on the unbalanced input terminal side in this embodiment, impedance matching can be carried out for the entire surface acoustic wave device 130B, and the attenuation suddenly drops in the vicinity of the passband on the low-frequency side. Accordingly, with the surface acoustic wave device 130B of this embodiment, balanced connection and impedance conversion can be carried out. Furthermore, the characteristics can be improved in a wider passband, and the passband characteristics can be improved on the low-frequency side.

Figure 27:
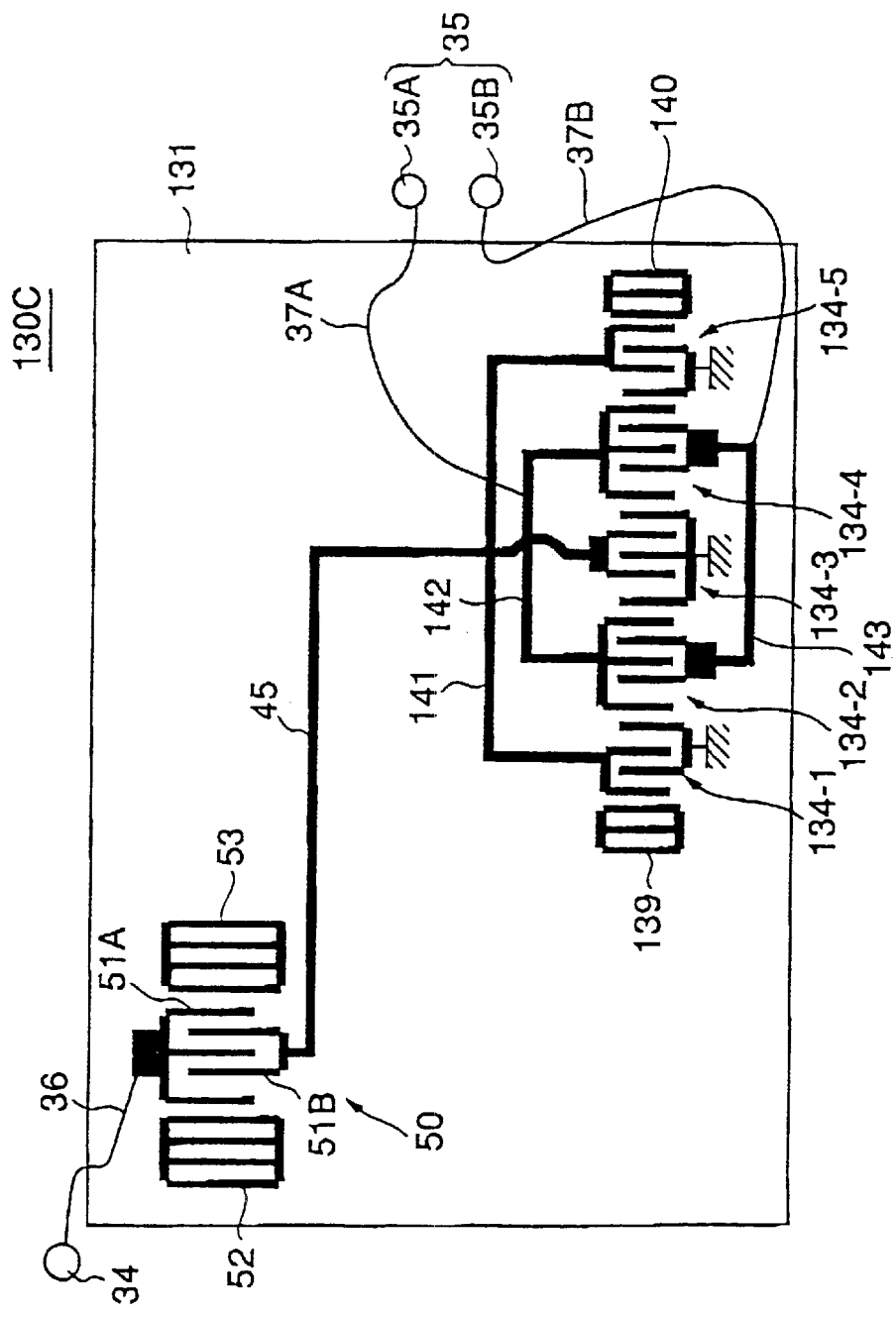
FIG. 27 shows a surface acoustic wave device of a twenty-third embodiment of the present invention.

FIG. 27 shows a surface acoustic wave device 130C of a twenty-third embodiment of the present invention. This surface acoustic wave device 130C also has a structure that is similar to the surface acoustic wave device 130A of the twenty-first embodiment shown in FIG. 25, except that the surface acoustic wave series resonator 50 is disposed on the unbalanced input terminal side.

As described above, with the 5-IDT filter, stable characteristics can be obtained in a wider passband. Also, since the surface acoustic wave series resonator 50 is disposed on the unbalanced input terminal side, impedance matching can be carried out for the entire surface acoustic wave device 130C, and the attenuation suddenly drops in the vicinity of the passband on the high-frequency side. Accordingly, with the surface acoustic wave device 130C of this embodiment, balanced connection and impedance conversion can be carried out. Furthermore, the characteristics can be improved in a wider passband, and the passband characteristics can be improved on the high-frequency side.

Figure 28:
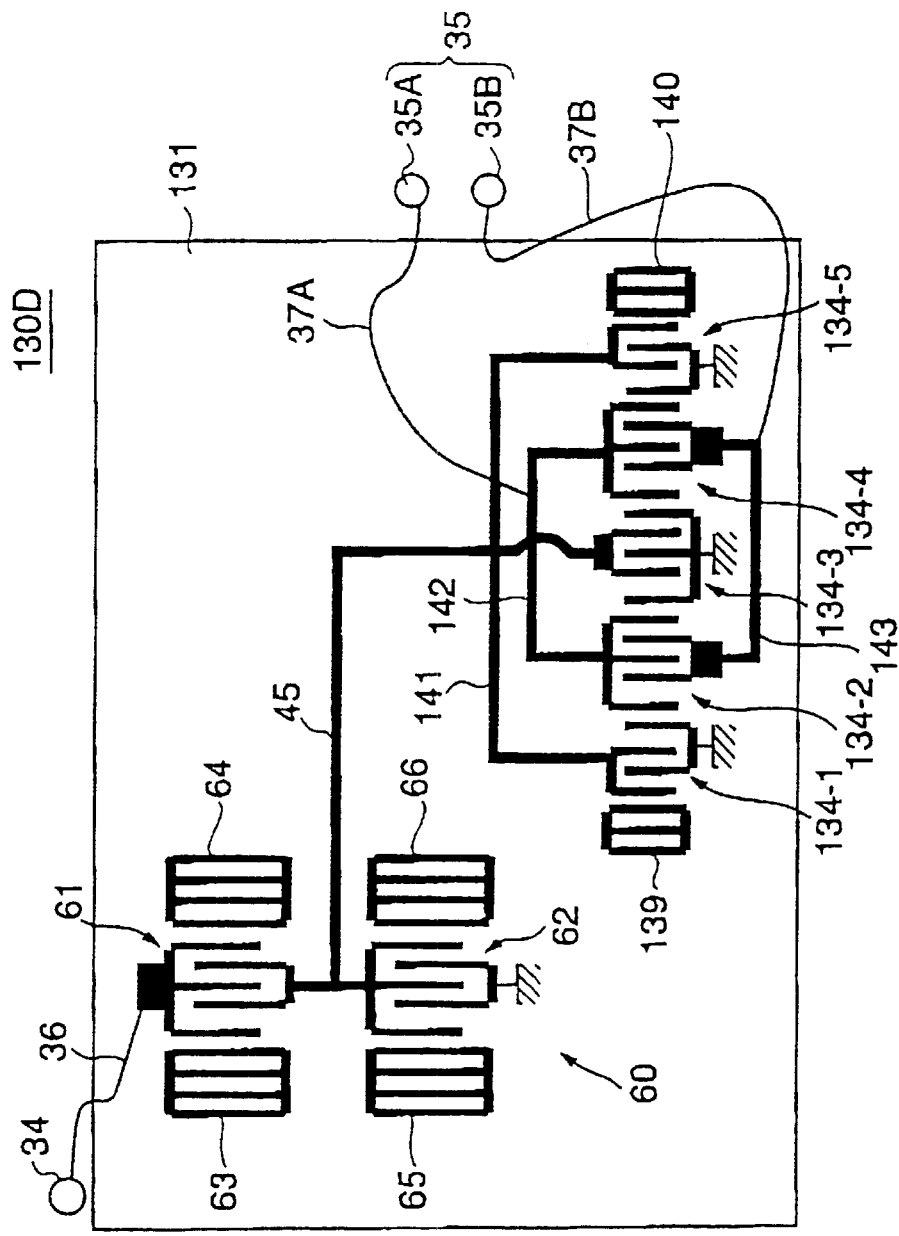
FIG. 28 shows a surface acoustic wave device of a twenty-fourth embodiment of the present invention.

FIG. 28 shows a surface acoustic wave device 130D of a twenty-fourth embodiment of the present invention. This surface acoustic wave device 130D also has a structure that is similar to the surface acoustic wave device 130A of the twenty-first embodiment shown in FIG. 25, except that the ladder-type filter 60 is disposed on the unbalanced input terminal side.

As described above, with the 5-IDT filter, stable characteristics can be obtained in a wider passband. Also, since the ladder-type filter 60 is disposed on the unbalanced input terminal side, impedance matching can be carried out for the entire surface acoustic wave device 130D, and the attenuation suddenly drops in the vicinity of the passband on both the high- and low-frequency sides. Accordingly, with the surface acoustic wave device 130D of this embodiment, balanced connection and impedance conversion can be carried out. Furthermore, excellent characteristics can be obtained in a wider passband, and the passband characteristics can be improved on both the high- and low-frequency sides.

Figure 29:
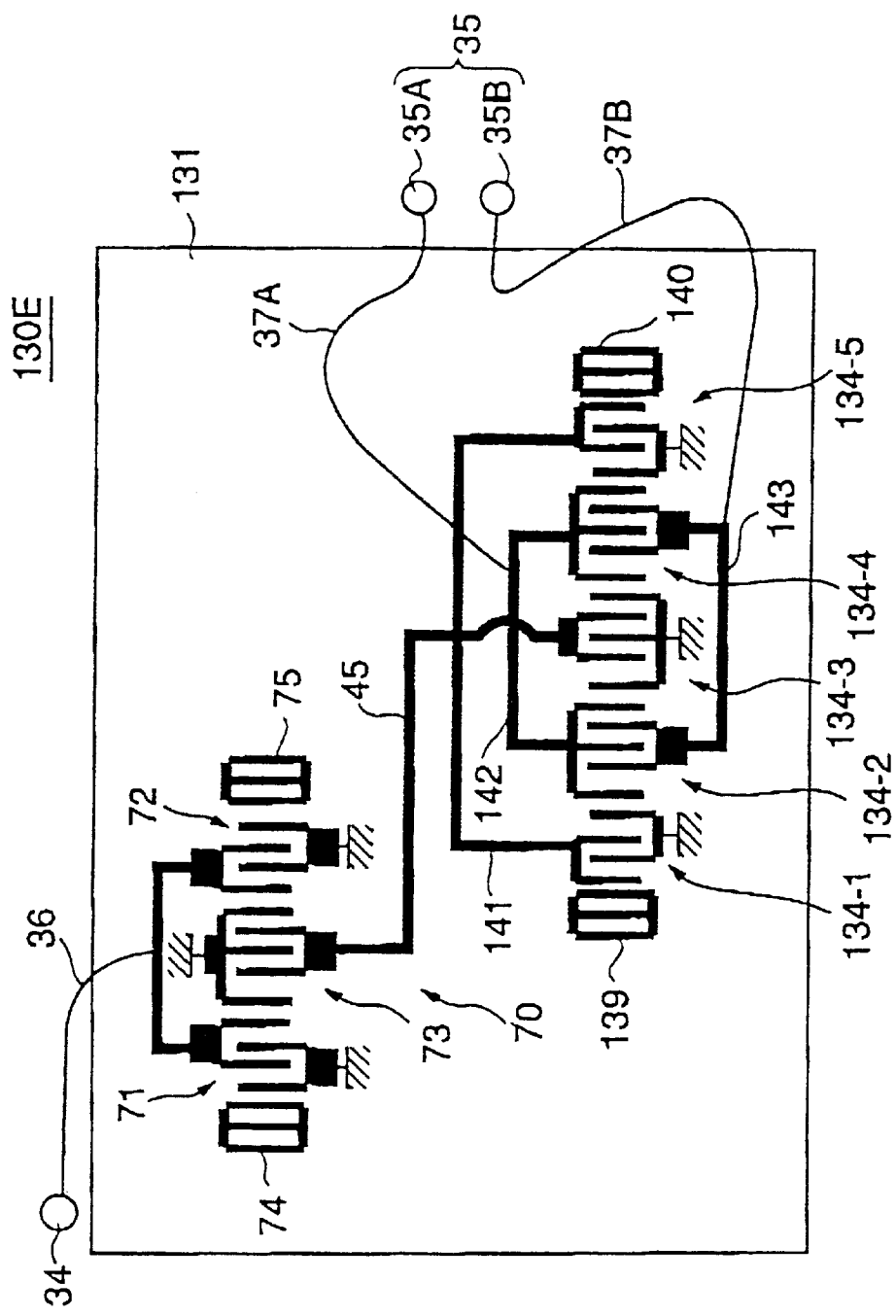
FIG. 29 shows a surface acoustic wave device of a twenty-fifth embodiment of the present invention.

FIG. 29 shows a surface acoustic wave device 130E of a twenty-fifth embodiment of the present invention. This surface acoustic wave device 130E also has a structure that is similar to the surface acoustic wave device 130A of the twenty-first embodiment shown in FIG. 25, except that the double-mode filter 70 is disposed on the unbalanced input terminal side.

As described above, with the 5-IDT filter, stable characteristics can be obtained in a wider passband. Also, since the double-mode filter 70 is disposed on the unbalanced input terminal side, impedance matching can be carried out for the entire surface acoustic wave device 130E, and the attenuation outside the passband can be made even larger. Accordingly, with the surface acoustic wave device 130E of this embodiment, balanced connection and impedance conversion can be carried out. Furthermore, the characteristics can be improved in a wider passband, and the attenuation outside the passband can be more securely maintained.

Figure 30:
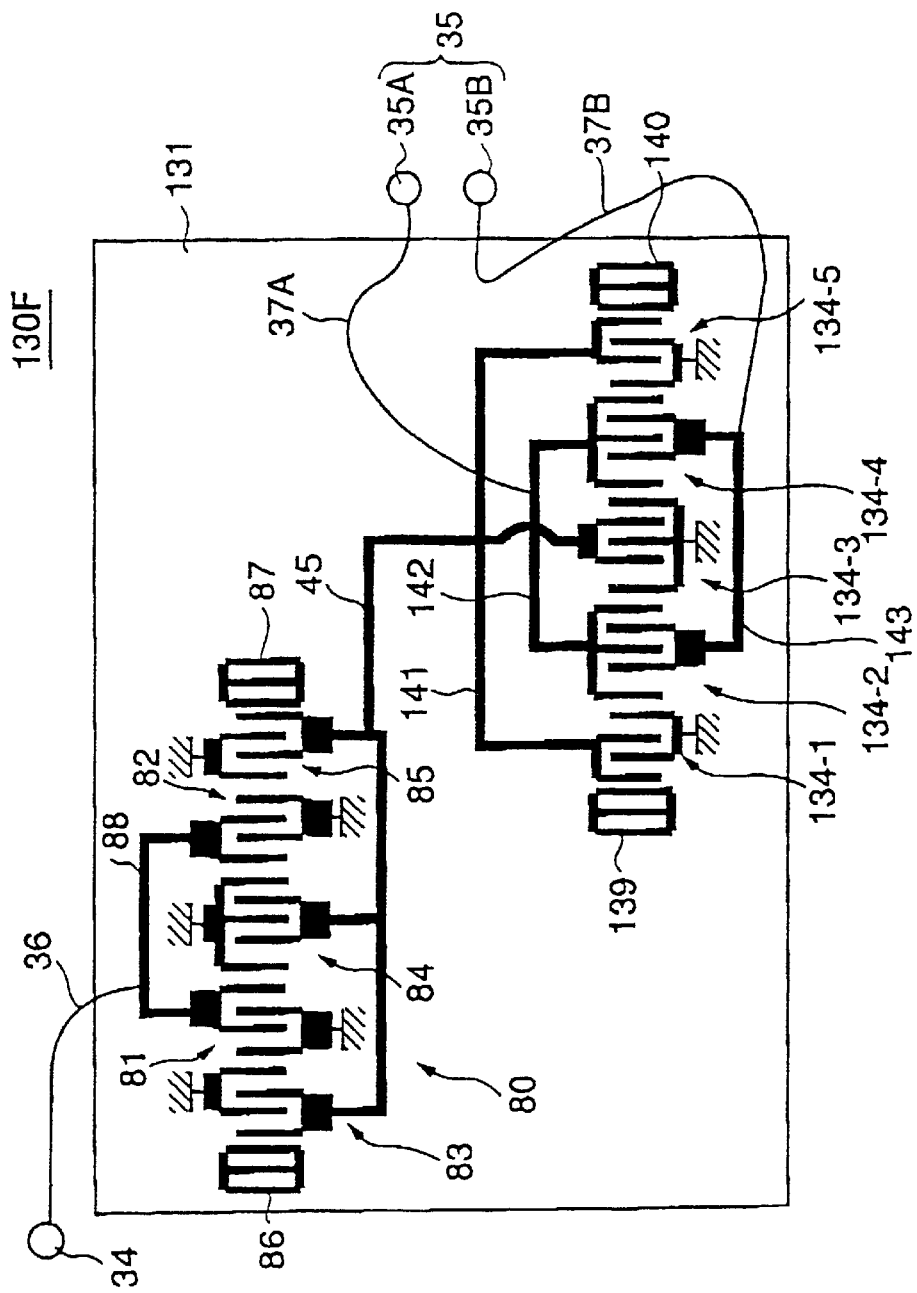
FIG. 30 shows a surface acoustic wave device of a twenty-sixth embodiment of the present invention.

FIG. 30 shows a surface acoustic wave device 130F of a twenty-sixth embodiment of the present invention. This surface acoustic wave device 130F also has a structure that is similar to the surface acoustic wave device 130A of the twenty-first embodiment shown in FIG. 25, except that the IIDT filter 80 is disposed on the unbalanced input terminal side.

As described above, with the 5-IDT filter, stable characteristics can be obtained in a wider passband. Also, since the IIDT filter 80 is disposed on the unbalanced input terminal side, impedance matching can be carried out for the entire surface acoustic wave device 130D, and the attenuation outside the passband can be made even larger. Accordingly, with the surface acoustic wave device 130F of this embodiment, balanced connection and impedance conversion can be carried out. Furthermore, the characteristics can be improved in a wider passband, and the attenuation outside the passband can be more securely maintained.

In the twenty-second embodiment to the twenty-sixth embodiment, the surface acoustic wave parallel resonator 40, the surface acoustic wave series resonator 50, the ladder-type filter 60, the double-mode filter 70, or the IIDT filter 80 is disposed on the piezoelectric substrate 131. However, the number of each of these components is not limited to 1. It is of course possible to employ a plurality of surface acoustic wave parallel resonators, a plurality of surface acoustic wave series resonators, a plurality of ladder-type filters, a plurality of double-mode filters, and a plurality of IIDT filters. Also, a combination of singular components and a plurality of components can be employed.

Figure 31:
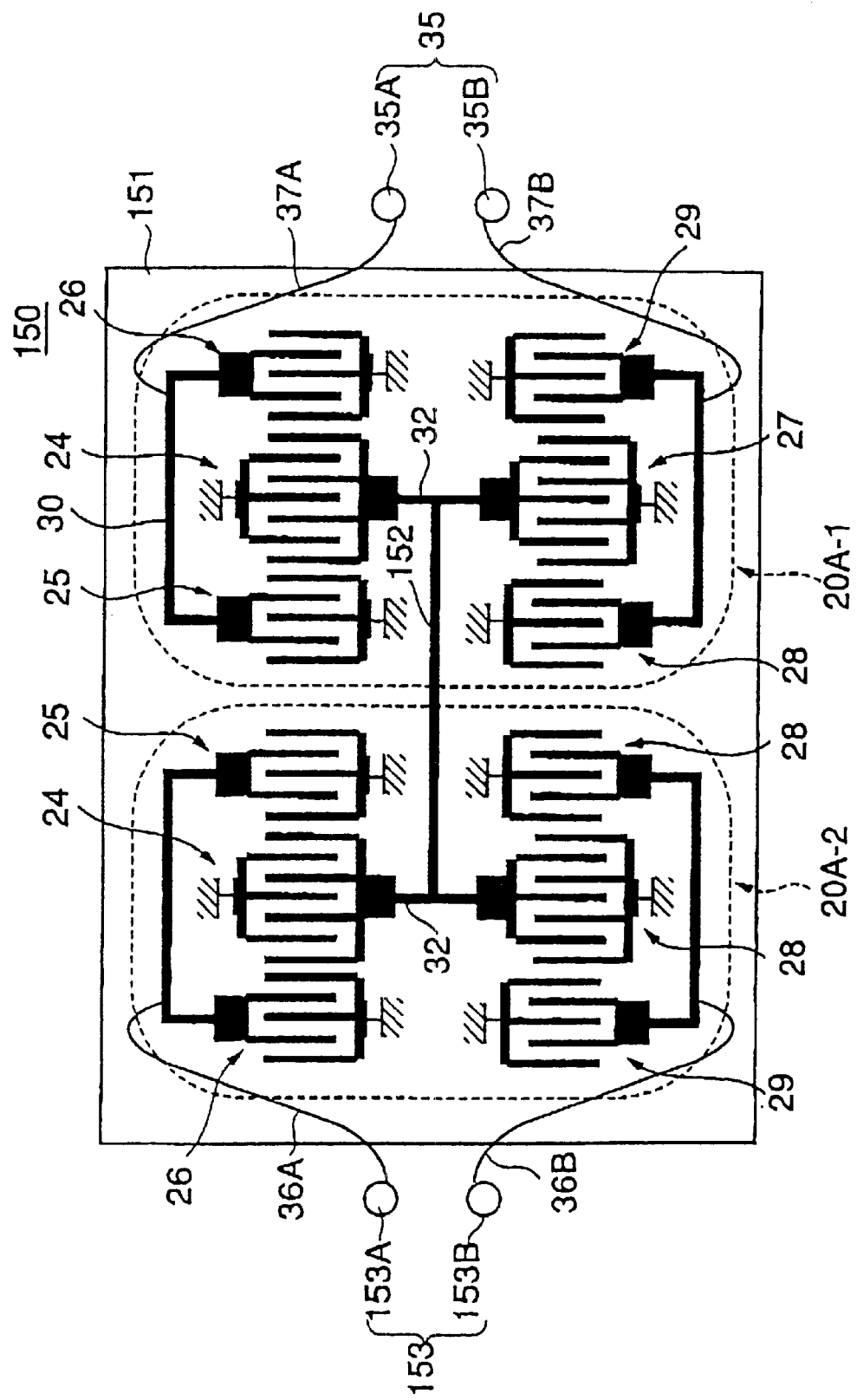
FIG. 31 shows a surface acoustic wave device of a twenty-seventh embodiment of the present invention.

FIG. 31 shows a surface acoustic wave device 150 of a twenty-seventh embodiment of the present invention. In this figure, the same components as in the surface acoustic wave device 20A shown in FIG. 3 are denoted by the same reference numerals, and explanations for those components are omitted.

This surface acoustic wave device 150 has two surface acoustic wave devices 20A of the first embodiment on a piezoelectric substrate 151. Hereinafter, one of the two surface acoustic wave devices 20A will be referred to as a first surface acoustic wave filter 20A-1, and the other one will be referred to as a second surface acoustic wave filter 20A-2.

The first surface acoustic wave filter 20A-1 and the second surface acoustic wave filter 20A-2 are symmetrically arranged on the piezoelectric substrate 21. The connecting wires 32 of the first and second surface acoustic wave filters 20A-1 and 20A-2 are connected to each other by a cascade-connecting wire 152. In other words, the first surface acoustic wave filter 20A-1 and the second surface acoustic wave filter 20A-2 are cascade-connected by the cascade-connecting wire 152.

Terminals 153A and 153B formed at the end portions of two input wires 36A and 36B extending from the second surface acoustic wave filter 20A-2 constitute a balanced terminal 153. Terminals 35A and 35B are formed at the end portions of the two output wires 37A and 37B extending from the first surface acoustic wave filter 20A-1. Accordingly, the surface acoustic wave device 150 of this embodiment is a surface acoustic wave filter of a balanced-input and balanced-output type.

Since the first and second surface acoustic wave filters 20A-1 and 20A-2 are cascade-connected, the attenuation is larger than (twice as large as) the attenuation obtained by the individual surface acoustic wave filter 20A-1 or 20A-2, as indicated by the arrow C in FIG. 8.

In the foregoing embodiments, the surface acoustic wave parallel resonator 40, the surface acoustic wave series resonator 50, the ladder-type filter 60, the double-mode filter 70, or the IIDT filter 80 is disposed on the unbalanced side. However, these components may be disposed on the balanced side. In such a case, both balanced output terminals 35A and 35B on the balanced side need to be connected to the surface acoustic wave parallel resonator 40, the surface acoustic wave series resonator 50, the ladder-type filter 60, the double-mode filter 70, or the IIDT filter 80. This structure might result in a larger surface acoustic wave device. Therefore, it is more advantageous to place one of them on the unbalanced side.

The present invention is not limited to the specifically disclosed embodiments, but variations and modifications may be made without departing from the scope of the present invention.

The present application is based on Japanese priority application No. 2000-077007, filed on Mar. 17, 2000, the entire contents of which are hereby incorporated by reference.

What is claimed is:

1. A surface acoustic wave device comprising:
   a piezoelectric substrate;
   a first surface acoustic wave filter that is formed on the piezoelectric substrate, and includes at least one input interdigital transducer and at least one output interdigital transducer that are alternately arranged on a surface acoustic wave path on the piezoelectric substrate; and
   a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
   the input interdigital transducers of the first and second surface acoustic wave filters are electrically connected to each other, or the output interdigital transducers of the first and second surface acoustic wave filters are electrically connected to each other;
   a terminal extending from the connecting point between the first surface acoustic wave filter and the second surface acoustic wave filter serves as an unbalanced terminal;
   a surface acoustic wave parallel resonator is disposed on the side of the unbalanced terminal; and
   terminals extending from the interdigital transducers that are not connected between the first and second surface acoustic wave filters serve as a balanced terminal.

2. A surface acoustic wave device comprising:
   a piezoelectric substrate;
   a first surface acoustic wave filter that is formed on the piezoelectric substrate, and includes at least one input interdigital transducer and at least one output interdigital transducer that are alternately arranged on a surface acoustic wave path on the piezoelectric substrate;
   a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
the input interdigital transducers of the first and second surface acoustic wave filters are electrically connected to each other, or the output interdigital transducers of the first and second surface acoustic wave filters are electrically connected to each other;
a terminal extending from the connecting point between the first surface acoustic wave filter and the second surface acoustic wave filter serves as an unbalanced terminal;
a surface acoustic wave series resonator is disposed on the side of the unbalanced terminal; and
terminals extending from the interdigital transducers that are not connected between the first and second surface acoustic wave filters serve as a balanced terminal.

3. A surface acoustic wave device comprising:
a piezoelectric substrate;
a first surface acoustic wave filter that is formed on the piezoelectric substrate, and includes at least one input interdigital transducer and at least one output interdigital transducer that are alternately arranged on a surface acoustic wave path on the piezoelectric substrate;
a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
the input interdigital transducers of the first and second surface acoustic wave filters are electrically connected to each other, or the output interdigital transducers of the first and second surface acoustic wave filters are electrically connected to each other;
a terminal extending from the connecting point between the first surface acoustic wave filter and the second surface acoustic wave filter serves as an unbalanced terminal;
a ladder-type filter is disposed on the side of the unbalanced terminal; and
terminals extending from the interdigital transducers that are not connected between the first and second surface acoustic wave filters serve as a balanced terminal.

4. A surface acoustic wave device comprising:
a piezoelectric substrate;
a first surface acoustic wave filter that is formed on the piezoelectric substrate, and includes at least one input interdigital transducer and at least one output interdigital transducer that are alternately arranged on a surface acoustic wave path on the piezoelectric substrate;
a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
the input interdigital transducers of the first and second surface acoustic wave filters are electrically connected to each other, or the output interdigital transducers of the first and second surface acoustic wave filters are electrically connected to each other;
a terminal extending from the connecting point between the first surface acoustic wave filter and the second surface acoustic wave filter serves as an unbalanced terminal;
a double-mode filter that has three interdigital transducers interposed between two reflectors is disposed on the side of the unbalanced terminal; and
terminals extending from the interdigital transducers that are not connected between the first and second surface acoustic wave filters serve as a balanced terminal.

5. A surface acoustic wave device comprising:
a piezoelectric substrate;
a first surface acoustic wave filter that is formed on the piezoelectric substrate, and includes at least one input interdigital transducer and at least one output interdigital transducer that are alternately arranged on a surface acoustic wave path on the piezoelectric substrate;
a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
the input interdigital transducers of the first and second surface acoustic wave filters are electrically connected to each other, or the output interdigital transducers of the first and second surface acoustic wave filters are electrically connected to each other;
a terminal extending from the connecting point between the first surface acoustic wave filter and the second surface acoustic wave filter serves as an unbalanced terminal;
an IIDT (interdigited interdigital transducer) filter that includes five interdigital transducers is disposed on the side of the unbalanced terminal; and
terminals extending from the interdigital transducers that are not connected between the first and second surface acoustic wave filters serve as a balanced terminal.

6. A surface acoustic wave device comprising:
a piezoelectric substrate;
a first surface acoustic wave filter that is formed on the piezoelectric substrate, and includes at least one input interdigital transducer and at least one output interdigital transducer that are alternately arranged on a surface acoustic wave path on the piezoelectric substrate;
a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:
the input interdigital transducers of the first and second surface acoustic wave filters are electrically connected to each other, or the output interdigital transducers of the first and second surface acoustic wave filters are electrically connected to each other;
the first and second surface acoustic wave filters are double-mode filters each including three interdigital transducers interposed between two reflectors;
the input interdigital transducers of the first and second surface acoustic wave filters are electrically connected to each other, or the output interdigital transducers of the first and second surface acoustic wave filters are electrically connected to each other;

a terminal extending from the connecting point between the first surface acoustic wave filter and the second surface acoustic wave filter serves as an unbalanced terminal; and terminals extending from the interdigital transducers that are not connected between the first and second surface acoustic wave filters serve as a balanced terminal.

7. The surface acoustic wave device as claimed in claim 6, wherein a surface acoustic wave parallel resonator is disposed on the side of the unbalanced terminal.

8. The surface acoustic wave device as claimed in claim 6, wherein a surface acoustic wave series resonator is disposed on the side of the unbalanced terminal.

9. The surface acoustic wave device as claimed in claim 6, wherein a ladder-type filter is disposed on the side of the unbalanced terminal.

10. The surface acoustic wave device as claimed in claim 6, wherein a double-mode filter that has three interdigital transducers interposed between two reflectors is disposed on the side of the unbalanced terminal.

11. The surface acoustic wave device as claimed in claim 6, wherein an IIDT (interdigited interdigital transducer) filter that includes five interdigital transducers is disposed on the side of the unbalanced terminal.

12. A surface acoustic wave device comprising:

a piezoelectric substrate;

a first surface acoustic wave filter that is formed on the piezoelectric substrate, and includes at least one input interdigital transducer and at least one output interdigital transducer that are alternately arranged on a surface acoustic wave path on the piezoelectric substrate;

a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:

the first and second surface acoustic wave filters are IIDT (interdigited interdigital transducer) filters each including five interdigital transducers;

the input interdigital transducers of the first and second surface acoustic wave filters are electrically connected to each other, or the output interdigital transducers of the first and second surface acoustic wave filters are electrically connected to each other;

a terminal extending from the connecting point between the first surface acoustic wave filter and the second surface acoustic wave filter serves as an unbalanced terminal, and;

terminals extending from the interdigital transducers that are not connected between the first and second surface acoustic wave filters serve as a balanced terminal.

13. The surface acoustic wave device as claimed in claim 12, wherein a surface acoustic wave parallel resonator is disposed on the side of the unbalanced terminal.

14. The surface acoustic wave device as claimed in claim 12, wherein a surface acoustic wave series resonator is disposed on the side of the unbalanced terminal.

15. The surface acoustic wave device as claimed in claim 12, wherein a ladder-type filter is disposed on the side of the unbalanced terminal.

16. The surface acoustic wave device as claimed in claim 12, wherein a double-mode filter that has three interdigital transducers interposed between two reflectors is disposed on the side of the unbalanced terminal.

17. The surface acoustic wave device as claimed in claim 12, wherein an IIDT (interdigited interdigital transducer) filter that includes five interdigital transducers is disposed on the side of the unbalanced terminal.

18. A surface acoustic wave device comprising:

a piezoelectric substrate;

five interdigital transducers, arranged on a surface acoustic wave path on the piezoelectric substrate, wherein among the first, third, and fifth interdigital transducers counted from one end of said device serve as input interdigital transducers, and are electrically connected at electrodes on one side, with an unbalanced terminal extending from a connecting point among the electrodes on the one side, a surface acoustic wave parallel resonator is disposed on the side of the unbalanced terminal;

second and fourth interdigital transducers counted from the one end of said device as output interdigital transducers, with a phase difference between electrodes on one side and electrodes on the other side of the second and fourth interdigital transducers being 180°; and a first terminal extends from a connection point between the electrically connected electrodes on the one side of the second and fourth interdigital transducers, while a second terminal extends from a connecting point between the electrically connected electrodes on the other side of the second and fourth interdigital transducers, the first terminal and the second terminal constituting a balanced terminal.

19. A surface acoustic wave device comprising:

a piezoelectric substrate;

five interdigital transducers, arranged on a surface acoustic wave path on the piezoelectric substrate, wherein among the first, third, and fifth interdigital transducers counted from one end of said device serve as input interdigital transducers, and are electrically connected at electrodes on one side, with an unbalanced terminal extending from a connecting point among the electrodes on the one side, a surface acoustic wave series resonator is disposed on the side of the unbalanced terminal;

second and fourth interdigital transducers counted from the one end of said device serve as output interdigital transducers, with a phase difference between electrodes on one side and electrodes on the other side of the second and fourth interdigital transducers being 180°; and a first terminal extends from a connecting point between the electrically connected electrodes on the one side of the second and fourth interdigital transducers, while a second terminal extends from a connecting point between the electrically connected electrodes on the other side of the second and fourth interdigital transducers, the first terminal and the second terminal constituting a balanced terminal.

20. A surface acoustic wave device comprising:

a piezoelectric substrate;

five interdigital transducers, arranged on a surface acoustic wave path on the piezoelectric substrate, wherein among the first, third, and fifth interdigital transducers counted from one end of said device serve as input interdigital transducers, and are electrically connected at electrodes on one side, with an unbalanced terminal extending from a connecting point among the electrodes on the one side, a ladder-type filter is disposed on the side of the unbalanced terminal;

second and fourth interdigital transducers counted from the one end of said device serve as output interdigital transducers, with a phase difference between electrodes on one side and electrodes on the other side of the second and fourth interdigital transducers being 180°; and a first terminal extends from a connecting point between the electrically connected electrodes on the one side of the second and fourth interdigital transducers, while a second terminal extends from a connecting point between the electrically connected electrodes on the other side of the second and fourth interdigital transducers, the first terminal and the second terminal constituting a balanced terminal.

21. A surface acoustic wave device comprising:

A piezoelectric substrate;

five interdigital transducers, arranged on a surface acoustic wave path on the piezoelectric substrate, wherein among the first, third, and fifth interdigital transducers counted from one end of said device serve as input interdigital transducers, and are electrically connected at electrodes on one side, with an unbalanced terminal extending from a connecting point among the electrodes on the one side, a double mode filter that has three interdigital transducers interposed between two reflectors is disposed on the side of the unbalanced terminal;

second and fourth interdigital transducers counted from the one end of said device serve as output interdigital transducers, with a phase difference between electrodes on one side and electrodes on the other side of the second and fourth interdigital transducers being 180°; and a first terminal extends from a connecting point between the electrically connected electrodes on the one side of the second and fourth interdigital transducers, while a second terminal extends from a connecting point between the electrically connected electrodes on the other side of the second and fourth interdigital transducers, the first terminal and the second terminal constituting a balanced terminal.

22. A surface acoustic wave device comprising:

a piezoelectric substrate;

five interdigital transducers, arranged on a surface acoustic wave path on the piezoelectric substrate, wherein among the first, third, and fifth interdigital transducers counted from one end of said device serve as input interdigital transducers, and are electrically connected at electrodes on one side, with an unbalanced terminal extending from a connecting point among the electrodes on the one side, an IIDT filter that includes five interdigital transducers is disposed on the side of the unbalanced terminal;

second and fourth interdigital transducers counted from the one end of said device serve as output interdigital transducers, with a phase difference between electrodes on one side and electrodes on the other side of the second and fourth interdigital transducers being 180°; and a first terminal extends from a connecting point between the electrically connected electrodes on the one side of the second and fourth interdigital transducers, while a second terminal extends from a connecting point between the electrically connected electrodes on the other side of the second and fourth interdigital transducers, the first terminal and the second terminal constituting a balanced terminal.

23. A surface acoustic wave device comprising:

a piezoelectric substrate;

a first surface acoustic wave filter that is formed on the piezoelectric substrate, and includes at least one input interdigital transducer and at least one output interdigital transducer that are alternately arranged on a surface acoustic wave path on the piezoelectric substrate;

a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:

the input interdigital transducers of the first and second surface acoustic wave filters are electrically connected to each other, or the output interdigital transducers of the first and second surface acoustic wave filters are electrically connected to each other;

a terminal extending from the connecting point between the first surface acoustic wave filter and the second surface acoustic wave filter serves as an unbalanced terminal;

terminals extending from the interdigital transducers that are not connected between the first and second surface acoustic wave filters serve as a balanced terminal; and the piezoelectric substrate comprises a rotated-Y single-crystal plate of $LiTaO_3$ having a cut angle between 40° Y and 44° Y.

24. A surface acoustic wave device comprising:

a piezoelectric substrate;

a first surface acoustic wave filter that is formed on the piezoelectric substrate, and includes at least one input interdigital transducer and at least one output interdigital transducer that are alternately arranged on a surface acoustic wave path on the piezoelectric substrate;

a second surface acoustic wave filter that includes at least one input interdigital transducer and at least one output interdigital transducer that are alternately arranged on the surface acoustic wave path on the piezoelectric substrate, a phase difference between the first surface acoustic wave filter and the second surface acoustic wave filter being approximately 180°, wherein:

the input interdigital transducers of the first and second surface acoustic wave filters are electrically connected to each other, or the output interdigital transducers of the first and second surface acoustic wave filters are electrically connected to each other;

a terminal extending from the connecting point between the first surface acoustic wave filter and the second surface acoustic wave filter serves as an unbalanced terminal;

terminals extending from the interdigital transducers that are not connected between the first and second surface acoustic wave filters serve as a balanced terminal; and the piezoelectric substrate comprises a rotated-Y single-crystal plate of $LiNbO_3$ having a cut angle between 66° Y and 74° Y.

\* \* \* \* \*